(12) United States Patent
Noda

(10) Patent No.: US 9,130,020 B2
(45) Date of Patent: Sep. 8, 2015

(54) SEMICONDUCTOR MEMORY DEVICE AND METHOD FOR MANUFACTURING SAME

(71) Applicant: Kabushiki Kaisha Toshiba, Minato-ku (JP)

(72) Inventor: Kotaro Noda, Mie-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 13/948,486

(22) Filed: Jul. 23, 2013

(65) Prior Publication Data
US 2014/0217598 A1 Aug. 7, 2014

Related U.S. Application Data

(60) Provisional application No. 61/759,680, filed on Feb. 1, 2013.

(51) Int. Cl.
H01L 29/788 (2006.01)
H01L 21/768 (2006.01)
H01L 45/00 (2006.01)
H01L 27/24 (2006.01)

(52) U.S. Cl.
CPC ...... H01L 21/76838 (2013.01); H01L 27/2481 (2013.01); H01L 45/04 (2013.01); H01L 45/1233 (2013.01); H01L 45/146 (2013.01); H01L 45/147 (2013.01); H01L 45/1675 (2013.01)

(58) Field of Classification Search
CPC ............... H01L 27/2481; H01L 27/11578; H01L 27/11551; H01L 21/76838; H01L 23/522; H01L 45/04; H01L 45/147; H01L 45/146; H01L 21/768

USPC ........ 257/1, 773, 774, E23.01, 314, 315, 317, 257/324, 326; 438/633; 365/51, 158, 148, 365/63
See application file for complete search history.

(56) References Cited

U.S. PATENT DOCUMENTS

| 8,860,116 B2 | 10/2014 | Sakaguchi et al. |
| 8,975,178 B2 * | 3/2015 | Kikutani et al. ............. 438/624 |
| 2010/0052030 A1 | 3/2010 | Sakaguchi et al. |
| 2011/0070713 A1 | 3/2011 | Nansei |
| 2011/0164444 A1 * | 7/2011 | Fukano ........................... 365/51 |

(Continued)

FOREIGN PATENT DOCUMENTS

| JP | 2008-277550 A | 11/2008 |
| JP | 2010-56443 A | 3/2010 |
| JP | 2013-62380 | 4/2013 |
| JP | 2013-65772 | 4/2013 |

Primary Examiner — Yosef Gebreyesus
(74) Attorney, Agent, or Firm — Oblon, McClelland, Maier & Neustadt, L.L.P.

(57) ABSTRACT

According to one embodiment, a semiconductor memory device includes a plurality of interconnects of an nth layer, a plurality of interconnects of a (n+1)th layer, a plurality of stacked films of the nth layer, each of the plurality of stacked films of the nth layer including a memory element, an inter-layer insulating film of the nth layer, a plurality of interconnects of a (n+2)th layer, a plurality of stacked films of the (n+1)th layer, each of the plurality of stacked films of the (n+1)th layer including a memory element, and an inter-layer insulating film of the (n+1)th layer. The inter-layer insulating film of the (n+1)th layer is provided also at a side surface of an end portion in the first direction of the interconnects of the nth layer.

7 Claims, 28 Drawing Sheets

(56) References Cited

U.S. PATENT DOCUMENTS

| | | | |
|---|---|---|---|
| 2011/0175048 A1* | 7/2011 | Sekine et al. | 257/2 |
| 2011/0260131 A1* | 10/2011 | Sonehara | 257/2 |
| 2011/0278527 A1* | 11/2011 | Ishibashi | 257/1 |
| 2011/0306199 A1* | 12/2011 | Nojiri et al. | 438/618 |
| 2013/0264535 A1* | 10/2013 | Sonehara | 257/4 |

* cited by examiner

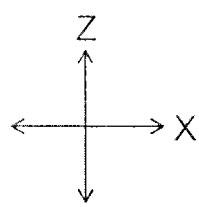
FIG. 10A
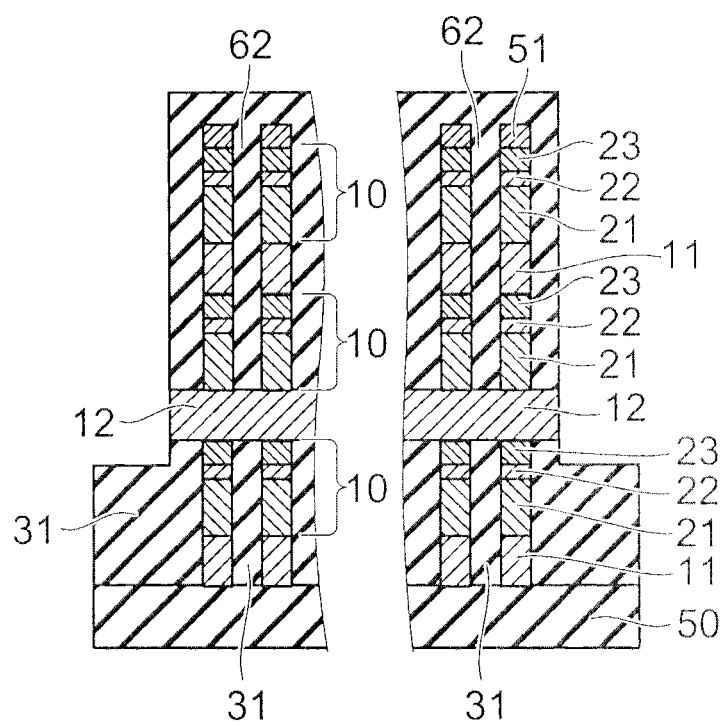
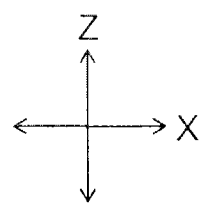
FIG. 10B
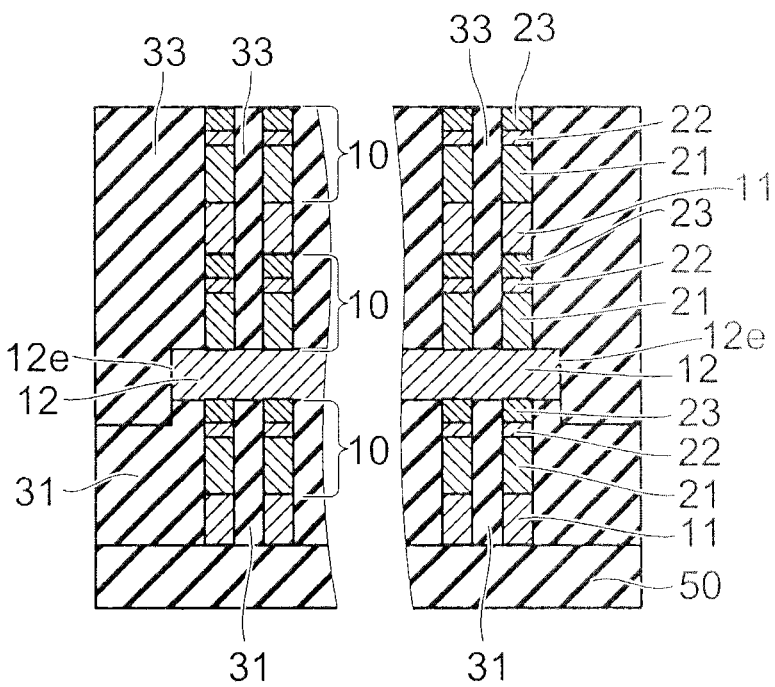

SEMICONDUCTOR MEMORY DEVICE AND METHOD FOR MANUFACTURING SAME

CROSS-REFERENCE TO RELATED APPLICATION

This application is based upon and claims the benefit of priority from U.S. Provisional Patent Application 61/759,680, filed on Feb. 1, 2013; the entire contents of which are incorporated herein by reference.

FIELD

Embodiments described herein relate generally to a semiconductor memory device and a method for manufacturing the same.

BACKGROUND

As the shrinking of semiconductor devices progresses, it is desirable to form fine patterns that are finer than the resolution limit of the lithography. As one of a method for realizing this, a so-called sidewall transfer process has been proposed in which a sidewall film is formed on the sidewall of a sacrificial film (a mandrel) having a line configuration that is formed by lithography; and subsequently, the sacrificial film is removed to leave the sidewall film.

The sidewall film is formed in a loop configuration at the longitudinal-direction end of the sacrificial film. In the case where the interconnects, etc., of the foundation are patterned using the sidewall film as a mask, the longitudinal-direction ends of the interconnects also are formed in a closed loop configuration. In other words, the loop portion of the longitudinal-direction ends of a pair of mutually-adjacent interconnects are cut by using the process prepending to occur short of via the loop portion.

BRIEF DESCRIPTION OF THE DRAWINGS

FIGS. 2A to 14B are schematic cross-sectional views showing an example of a method for manufacturing the semiconductor memory device of a first embodiment;

DETAILED DESCRIPTION

Figure 1:
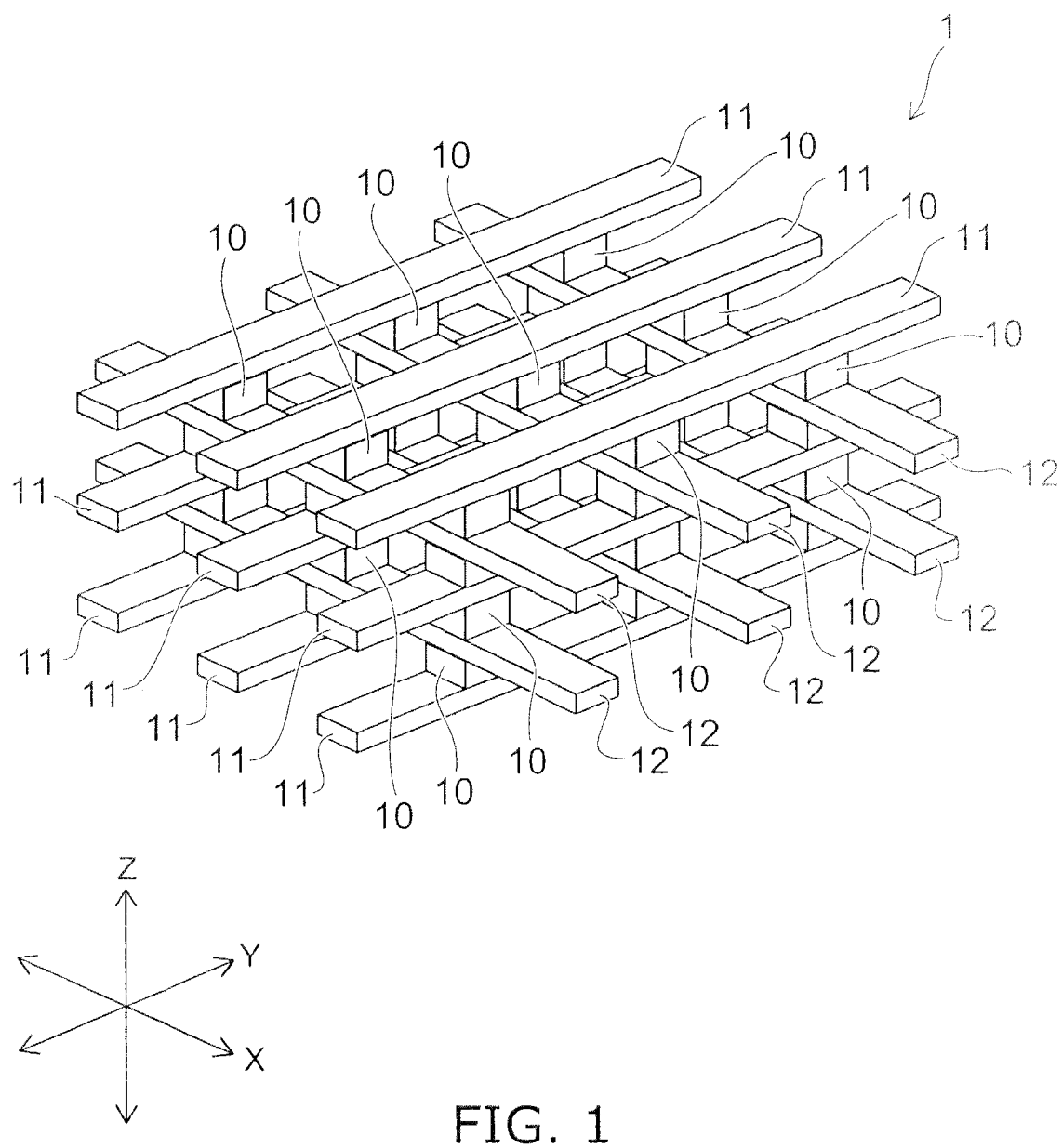
FIG. 1 is a schematic perspective view of an example of a portion of a memory cell array of a semiconductor memory device of an embodiment.

According to one embodiment, a semiconductor memory device includes a plurality of interconnects of an nth (n being a positive integer) layer extending in a first direction, a plurality of interconnects of a (n+1)th layer extending in a second direction crossing the first direction above the interconnects of the nth layer, a plurality of stacked films of the nth layer provided respectively at portions where the interconnects of the nth layer and the interconnects of the (n+1)th layer cross between the interconnects of the nth layer and the interconnects of the (n+1)th layer, each of the plurality of stacked films of the nth layer including a memory element, an inter-layer insulating film of the nth layer provided between the plurality of stacked films of the nth layer, a plurality of interconnects of a (n+2)th layer extending in the first direction above the interconnects of the (n+1)th layer, a plurality of stacked films of the (n+1)th layer provided respectively at portions where the interconnects of the (n+1)th layer and the interconnects of the (n+2)th layer cross between the interconnects of the (n+1)th layer and the interconnects of the (n+2)th layer, each of the plurality of stacked films of the (n+1)th layer including a memory element, and an inter-layer insulating film of the (n+1)th layer provided between the plurality of stacked films of the (n+1)th layer and between the plurality of interconnects of the (n+1)th layer. The inter-layer insulating film of the (n+1)th layer is provided also at a side surface of an end portion in the first direction of the interconnects of the nth layer.

Embodiments will now be described with reference to the drawings. Similar components in the drawings are marked with like reference numerals.

FIG. 1 is a schematic perspective view of an example of a portion of a memory cell array 1 of a semiconductor memory device of the embodiment.

The memory cell array 1 includes multiple first interconnects 11 and multiple second interconnects 12. Further, the memory cell array 1 includes stacked films 10 having pillar configurations provided between the first interconnects 11 and the second interconnects 12.

The first interconnects 11 and the second interconnects 12 cross each other three-dimensionally to be non-parallel. For example, the first interconnects 11 extend in a first direction (a Y direction); the second interconnects 12 extend in a second direction (an X direction) orthogonal to the first direction; and the first interconnects 11 and the second interconnects 12 are orthogonal to each other. Each of the multiple stacked films 10 is provided at a cross point where the first interconnects 11 and the second interconnects 12 cross each other.

The multiple stacked films 10 are disposed in two-dimensional directions (XY directions) in, for example, a matrix configuration; and an array having the matrix configuration is multiply stacked in a third direction (a Z direction) orthogonal to the XY plane.

FIG. 1 shows, for example, a portion in which 4 layers of an array of 3 rows by 3 columns are stacked.

The first interconnect 11 is shared by the stacked films 10 on and under the first interconnect 11. Similarly, the second interconnect 12 is shared by the stacked films 10 on and under the second interconnect 12.

The semiconductor memory device of the embodiment is formed in a chip configuration; and the memory cell array 1 is formed in a region including the center of the chip configuration.

Figure 14A:
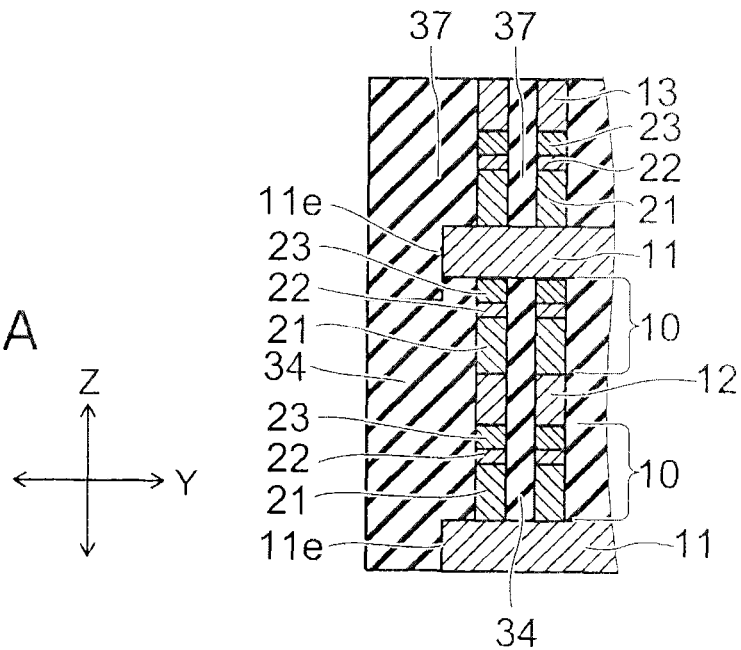

FIG. 14A is an example of a schematic cross-sectional view of the vicinity of one Y-direction end portion of the memory cell array 1.

Figure 14B:
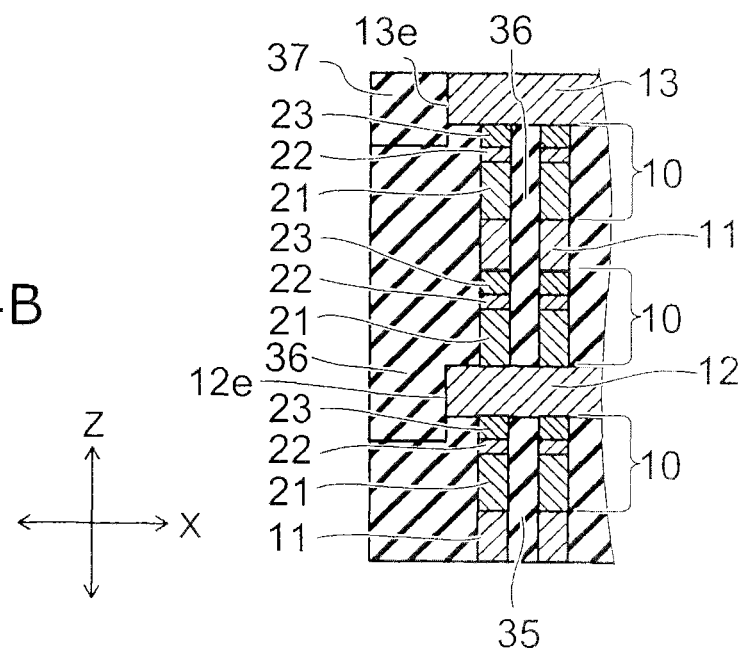

FIG. 14B is an example of a schematic cross-sectional view of the vicinity of one X-direction end portion of the memory cell array 1.

FIG. 14A and FIG. 14B show the cross sections of interconnects 13 of the uppermost layer that extend in the X direction, the interconnects 11 of the second layer from the top that extend in the Y direction, the interconnects 12 of the third layer from the top that extend in the X direction, the interconnects 11 of the fourth layer from the top that extend in the Y direction, and the stacked films 10 provided respectively in the spaces between the interconnects.

The stacked film 10 may include a memory element (a memory cell) and a rectifying element 21 that are connected in series between the interconnects on and under the stacked film 10.

The memory element includes a variable resistance film 22. The rectifying element 21 is, for example, a silicon diode having a PIN (p-intrinsic-n) structure. The rectifying element 21 may be omitted.

The variable resistance film 22 is electrically switchable between a state (a set state) in which the resistance is relatively low and a state (a reset state) in which the resistance is relatively high to nonvolatilely store data. The rectifying element 21 prevents sneak current (sneak current) when electrically accessing (forming/programming/erasing/reading) the memory cell that is selected.

The variable resistance film 22 includes, for example, a metal oxide. For example, an oxide of one type of metal selected from the group consisting of zirconium (Zr), titanium (Ti), aluminum (Al), hafnium (Hf), manganese (Mn), tantalum (Ta), and tungsten (W) or an alloy of two or more types of the metals can be used as the metal oxide.

The interconnects 11, 12, and 13 are metal interconnects. An electrode film 23 is provided between the variable resistance film 22 and the interconnect of the layer on the variable resistance film 22. The materials of the electrode film 23 and the interconnects 11, 12, and 13 are, for example, tungsten, titanium, tantalum, a nitride of tungsten, a nitride of titanium, a nitride of tantalum, etc.

Also, the variable resistance film 22 may be silicon; and the electrode film 23 may be nickel or platinum.

The variable resistance film 22 in the low resistance state (the set state) which has a relatively low resistance can be switched to the high resistance state (the reset state) which has a relatively high resistance when a reset voltage is applied to the variable resistance film 22 subjected to the operation via the interconnects on and under the interposed variable resistance film 22. The variable resistance film 22 can be switched to the low resistance state (the set state) when a set voltage that is higher than the reset voltage is applied to the variable resistance film 22 in the high resistance state (the reset state).

The stacked films 10 including the variable resistance films 22 are patterned into pillar configurations; and inter-layer insulating films 34 and 37 are provided between the stacked films 10 that are adjacent to each other in the Y direction as shown in FIG. 14A. As shown in FIG. 14B, the inter-layer insulating films 35 and 36 are provided between the stacked films 10 that are adjacent to each other in the X direction.

The inter-layer insulating film 37 is provided between the multiple interconnects 13 of the uppermost layer that extend in the X direction and are adjacent to each other in the Y direction. The inter-layer insulating film 34 is provided between the multiple interconnects 12 that extend in the X direction and are adjacent to each other in the Y direction. The inter-layer insulating films 35 and 36 are provided between the multiple interconnects 11 that extend in the Y direction and are adjacent to each other in the X direction.

Further, as shown in FIG. 14A, the inter-layer insulating films 34 and 37 are provided on the outer side of end portion 11e of a side surface of end of the interconnects 11 that extend in the Y direction; and the end portion 11e of the interconnects 11 are covered with the inter-layer insulating films 34 and 37. Also, the lower surface of the inter-layer insulating film 37 exists at a position that is lower than the lower surfaces of the interconnects 11. In other words, the boundary between the inter-layer insulating film 34 and the inter-layer insulating film 37 exists at a position that is lower than the lower surfaces of the interconnects 11. Further, the boundary between the inter-layer insulating film 34 and the inter-layer insulating film 37 exists to extend in the downward Z direction from the end portion 11e of the interconnects 11.

Figure 28A:
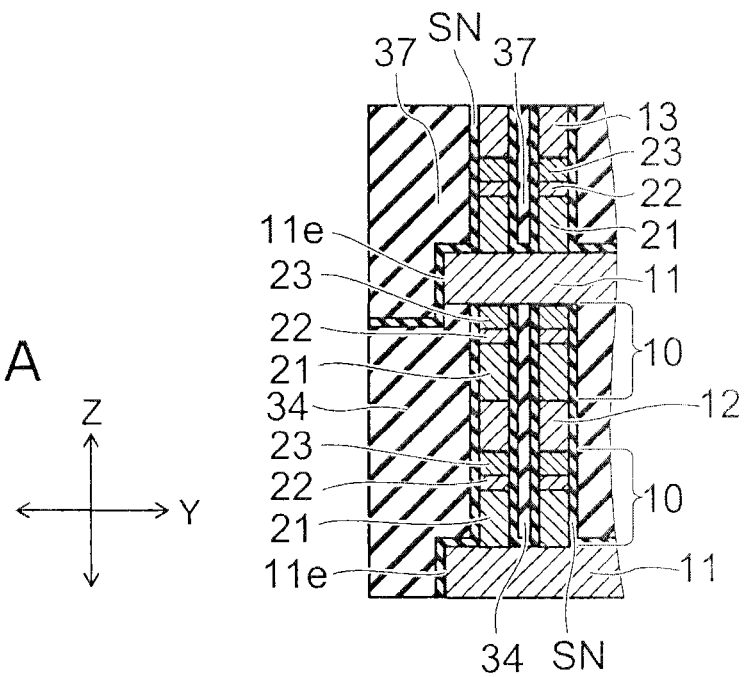
FIGS. 28A and 28B are schematic cross-sectional views showing an example of the method for manufacturing the semiconductor memory device of the first embodiment.
Figure 28B:
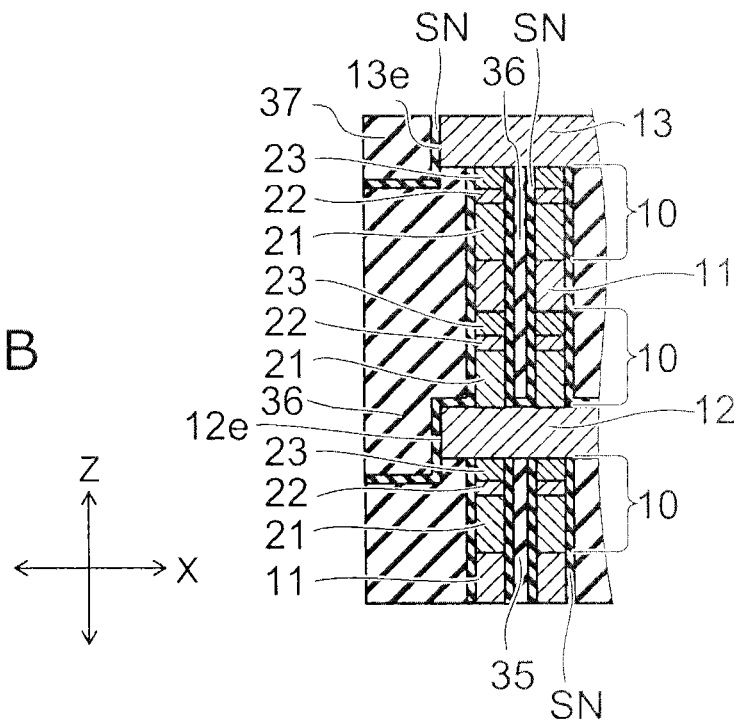

Also, an insulating film of a material that is different from those of the inter-layer insulating film 34 and the inter-layer insulating film 37 may exist between the inter-layer insulating film 34 and the inter-layer insulating film 37. For example, such a case includes the case where the inter-layer insulating film 34 and the inter-layer insulating film 37 are silicon oxide films and the insulating film of the material that is different from those of the inter-layer insulating film 34 and the inter-layer insulating film 37 is a silicon nitride film SN. The nitride film SN may be continuously formed, for example, from between the inter-layer insulating film 34 and the inter-layer insulating film 37 to the end portion 11e of the interconnect 11, the upper surface of the interconnect 11, and the side surfaces of the rectifying element 21, the variable resistance film 22, the electrode film 23, and the interconnect 13 (ref. FIGS. 28A and 28B).

Similarly, as shown in FIG. 14B, the inter-layer insulating film 36 is provided on the outer side of end portion 12e of a side surface of end of the interconnects 12 that extend in the X direction; and the end portion 12e of the interconnects 12 are covered with the inter-layer insulating film 36.

Also, as shown in FIG. 14B, the inter-layer insulating film 37 is provided on the outer side of end portion 13e of a side surface of end of the interconnects 13 that extend in the X direction; and the end portion 13e of the interconnects 13 of the uppermost layer are covered with the inter-layer insulating film 37.

A method for manufacturing the semiconductor memory device according to the first embodiment will now be described with reference to FIG. 2A to FIG. 19C.

Figure 2A:
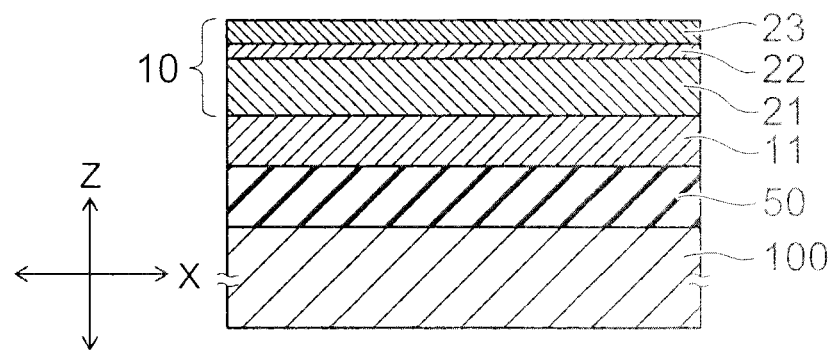

As shown in FIG. 2A, an insulating layer 50 is formed on the substrate 100. The substrate 100 is not shown in FIG. 2B and subsequent drawings.

The interconnect 11 of the nth (n being a positive integer) layer is formed on the insulating layer 50. The nth layer refers to the nth layer from the bottom using the substrate 100 as a reference. The case where the interconnect 11 shown in FIG. 2A is the interconnect 11 of the first layer is described as an example.

The stacked film 10 of the first layer is formed on the interconnect 11 of the first layer. In other words, the rectifying element 21, the variable resistance film 22, and the electrode film 23 are formed in order on the interconnect 11.

A sacrificial film 41 of the first layer is formed on the electrode film 23 of the uppermost layer of the stacked film 10 of the first layer. The sacrificial film 41 is formed on the entire surface of the electrode film 23; and, for example, a not-shown resist film is formed on the sacrificial film 41.

The resist film is patterned by exposing and developing; and the sacrificial film 41 is selectively etched by, for example, RIE (Reactive Ion Etching) using the patterned resist film as a mask.

Figure 2B:
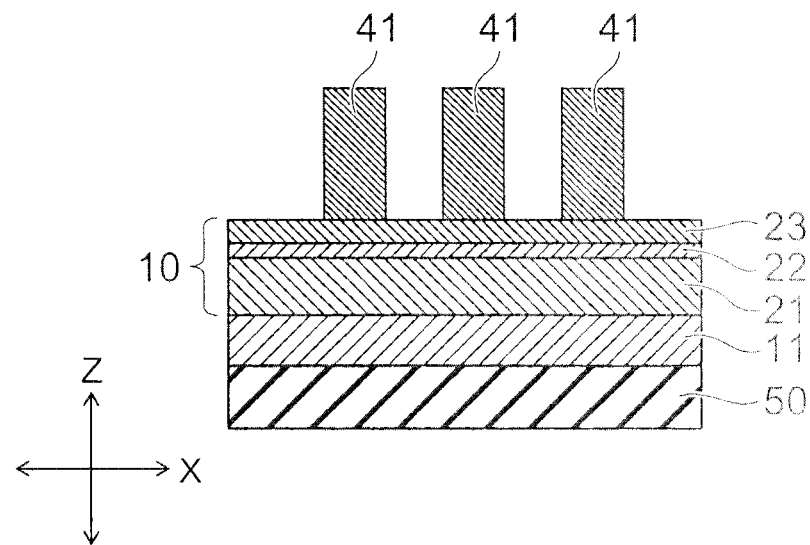

Thereby, as shown in FIG. 2B, the sacrificial film 41 is patterned into multiple line configurations that extend in the Y direction (the direction piercing the page surface in FIG. 2B).

Figure 2C:
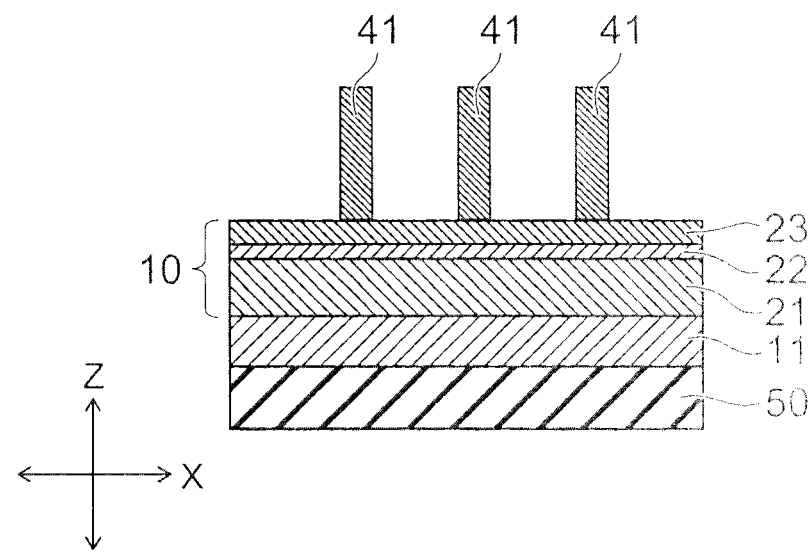
Figure 15A:
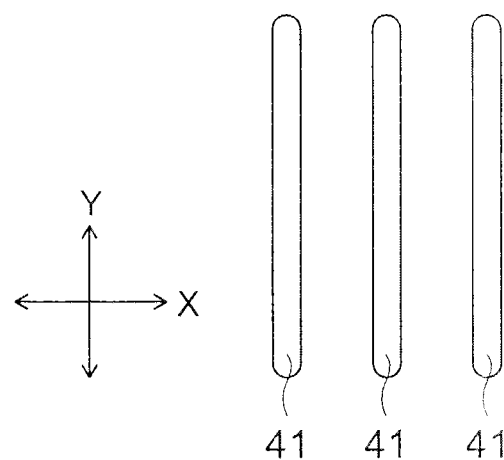
FIGS. 15A to 19C are schematic plan views showing an example of the method for manufacturing the semiconductor memory device of the first embodiment.

Then, as shown in FIG. 2C and FIG. 15A which is a schematic top view of FIG. 2C, the width of the sacrificial film is reduced (a slimming process) by, for example, hydrofluoric acid treatment.

Although the width of the sacrificial film 41 which has the line pattern is substantially the same as the spacing (the width of the space) between the mutually-adjacent sacrificial films 41 in the state of FIG. 2B prior to the slimming, the spacing (the width of the space) between the sacrificial films 41 is widened to about 3 times the width of the sacrificial film 41 after the slimming process.

Figure 3A:
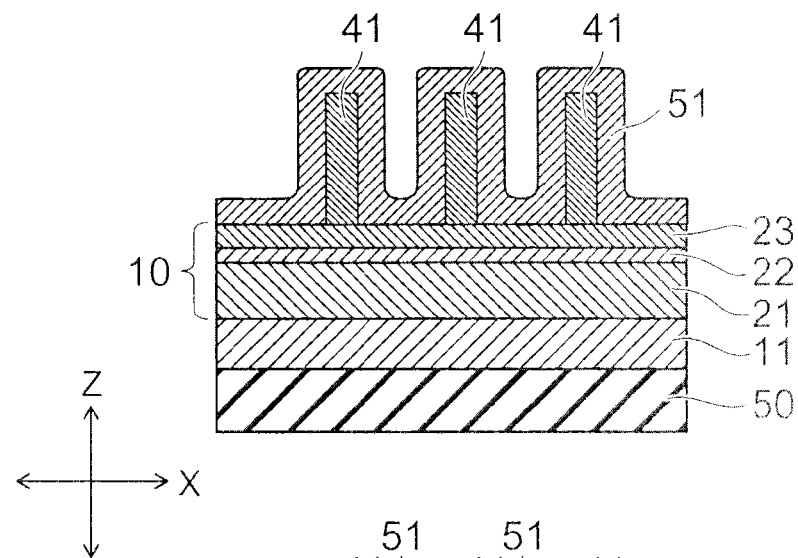

Then, as shown in FIG. 3A, a sidewall film 51 of the first layer is formed conformally along the upper surface of the electrode film 23 and the side surface and upper surface of the sacrificial film 41.

The sacrificial film 41 is a film of a material that is different from that of the electrode film 23; and the sidewall film 51 is a film of a material that is different from those of the electrode film 23 and the sacrificial film 41.

Figure 3B:
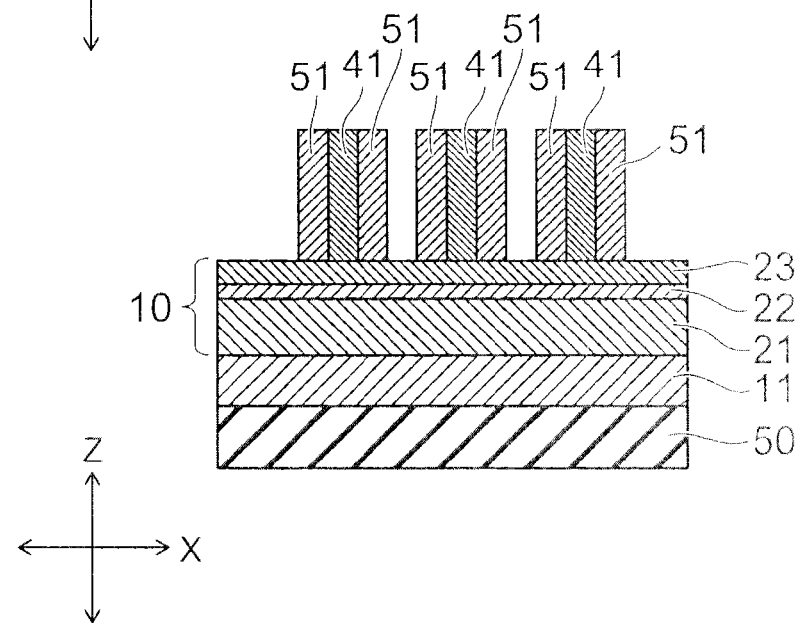
Figure 15B:
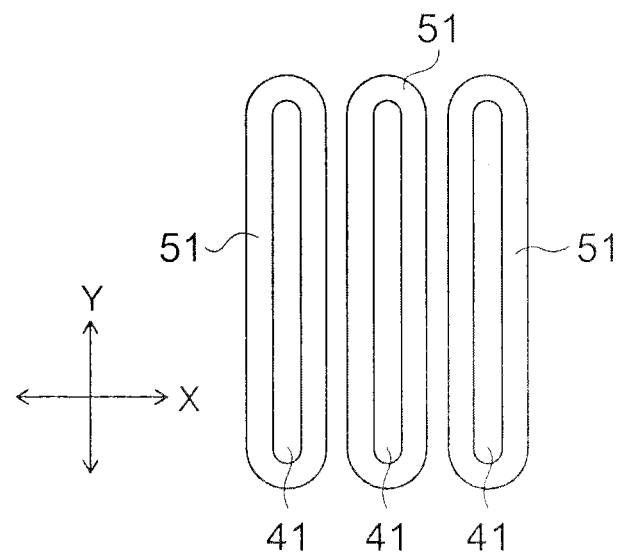

After forming the sidewall film 51, isotropic etch-back of the sidewall film 51 is performed by, for example, RIE. By the etch-back, the sidewall film 51 that is on the electrode film 23 and the sidewall film 51 that is on the upper surface of the sacrificial film 41 are removed to leave the sidewall film 51 at the sidewall of the sacrificial film 41 as shown in FIG. 3B and FIG. 15B. As shown in FIG. 15B, the sidewall film 51 is left also at the end wall of the longitudinal-direction end (the Y-direction end) of the sacrificial film 41.

In other words, the sidewall film 51 encloses the periphery of the sacrificial film 41 by forming a loop at the end of the sacrificial film 41 while extending in the Y direction along the sidewall of the sacrificial film 41.

The upper surface of the sacrificial film 41 is exposed by the removal by the etch-back of the sidewall film 51 deposited on the upper surface of the sacrificial film 41 recited above.

Figure 3C:
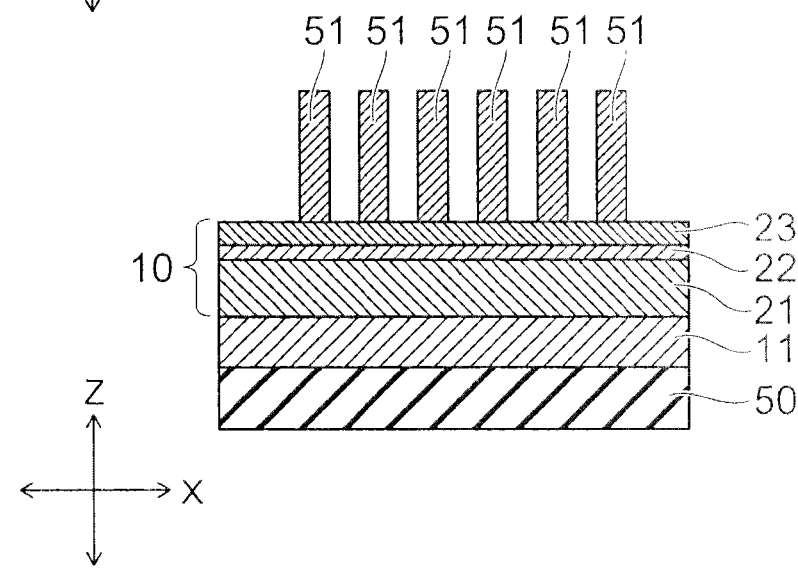
Figure 15C:
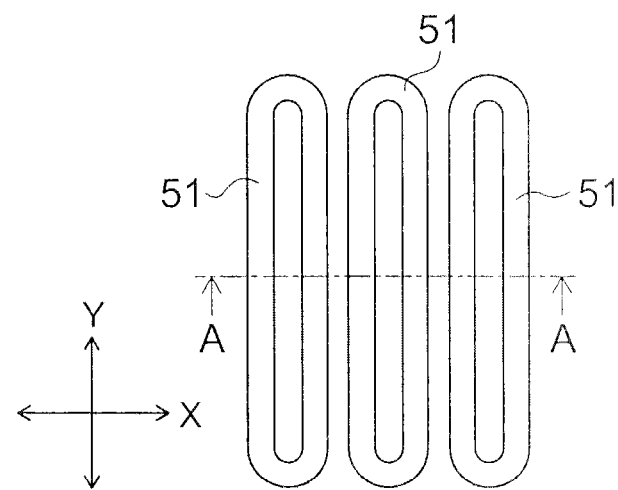

Then, the sacrificial film 41 is removed by, for example, hydrofluoric acid treatment. As shown in FIG. 3C and FIG. 15C, the sidewall film 51 is left on the stacked film 10. FIG. 3C corresponds to the A-A cross section of FIG. 15C.

The sidewall film 51 extends in the Y direction; and the Y-direction ends of a pair of sidewall films 51 adjacent to each other in the X direction are linked by forming a loop. In other words, the sidewall film 51 is formed in a closed loop pattern.

Then, the stacked film 10 of the first layer and the interconnect 11 of the first layer are etched by, for example, RIE using the sidewall film 51 formed in the closed loop pattern as a mask.

Figure 4A:
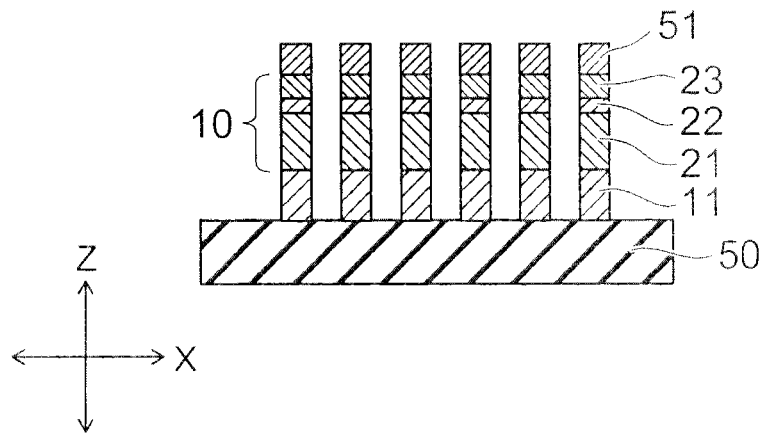

The stacked film 10 of the first layer and the interconnect of the first layer are patterned into fin configurations extending in the Y direction (the direction piercing the page surface in FIG. 4A) as shown in FIG. 4A.

When viewed in plan, the stacked film 10 of the first layer and the interconnect 11 of the first layer are patterned into a closed loop pattern to match the closed loop pattern of the sidewall film 51 which is the mask.

In other words, the stacked film 10 extends in the Y direction; and the Y-direction ends of a pair of stacked films 10 that are adjacent to each other in the X direction are linked by forming a loop. Similarly, the interconnect 11 extends in the Y direction; and the Y-direction ends of a pair of interconnects 11 adjacent to each other in the X direction are linked by forming a loop.

By the so-called sidewall transfer process described above, a line-and-space pattern is obtained to be arranged at a pitch that is narrower than the pitch that has the limitations of the resolution limit of the lithography. In other words, the stacked film 10 and the interconnect 11 are patterned into line-and-space patterns arranged at pitches that are narrower than the pitch of the sacrificial film 41 of FIG. 2B that has the limitations of the resolution limit of the lithography.

Figure 4B:
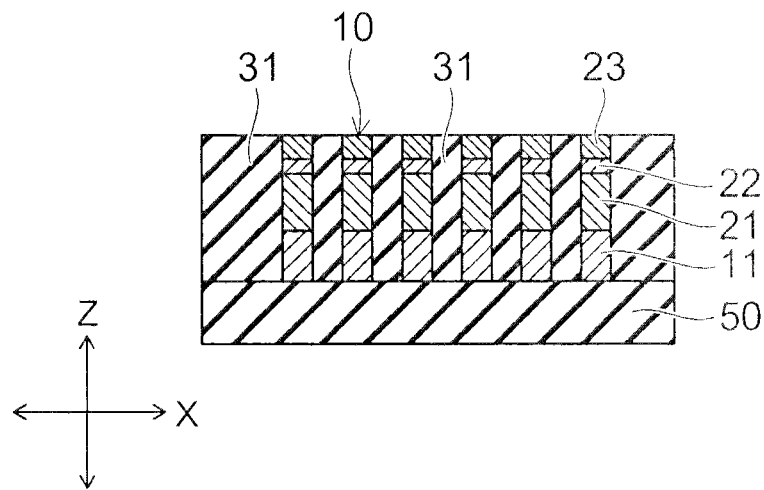

After the etching of the stacked film 10 of the first layer and the interconnect 11 of the first layer using the sidewall film 51 of the first layer as the mask described above, an inter-layer insulating film 31 of the first layer is formed in the space between the stacked films 10 of the first layer adjacent to each other in the X direction and the space between the interconnects 11 of the first layer adjacent to each other in the X direction as shown in FIG. 4B. Prior to the formation of the inter-layer insulating film 31, for example, a silicon nitride film may be continuously formed as a protective film from the interconnect 11 over the stacked film 10 to the side surface of the sidewall film 51.

After the inter-layer insulating film 31 is deposited to cover the stacked film 10 and the interconnect 11, the inter-layer insulating film 31 is polished by CMP (Chemical Mechanical Polishing) using the electrode film 23 of the uppermost layer of the stacked film 10 as a stopper; and the upper surface of the inter-layer insulating film 31 is planarized. The upper surface of the electrode film 23 is exposed.

Figure 4C:
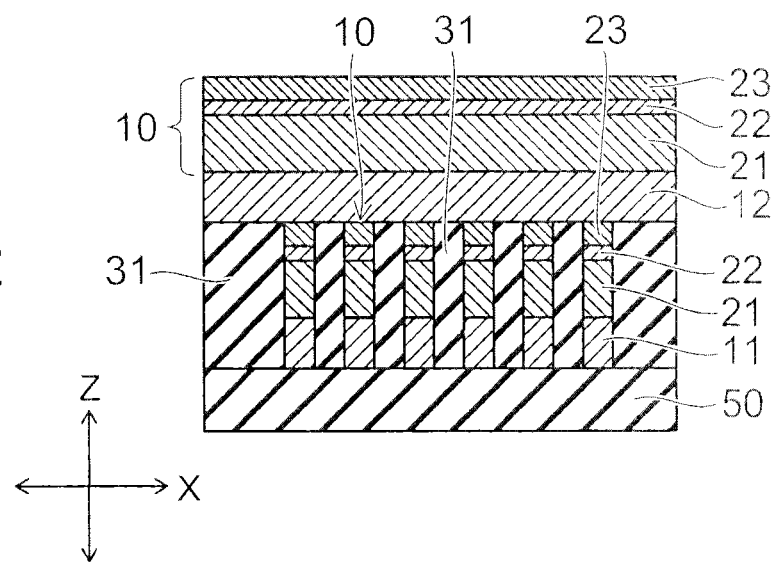

As shown in FIG. 4C, the interconnect 12 of the second layer is formed on the upper surface of the inter-layer insulating film 31 that is planarized and on the electrode film 23 that is exposed.

The stacked film 10 of the second layer is formed on the interconnect 12 of the second layer. In other words, the rectifying element 21, the variable resistance film 22, and the electrode film 23 are formed in order on the interconnect 12 of the second layer.

Similarly to the first layer described above, the sacrificial film 41 of the second layer is formed on the electrode film 23 of the uppermost layer of the stacked film 10 of the second layer. The sacrificial film 41 of the second layer is formed on the entire surface of the electrode film 23 of the second layer; and, for example, a not-shown resist film is formed on the sacrificial film 41.

The resist film is patterned by exposing and developing; and the sacrificial film 41 of the second layer is selectively etched by, for example, RIE using the patterned resist film as a mask.

Figure 16A:
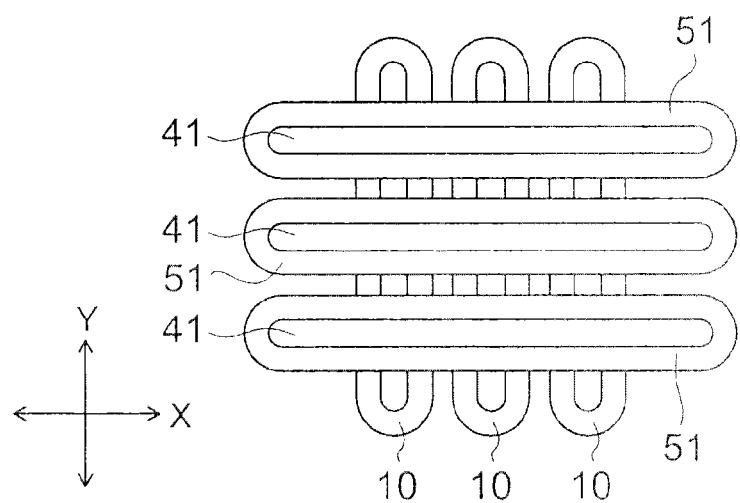

Thereby, as shown in FIG. 16A, the sacrificial film 41 of the second layer is patterned into multiple line configurations that extend in the X direction. The sacrificial film 41 of the second layer extends in the X direction that crosses (e.g., is orthogonal to) the Y direction in which the stacked film 10 of the first layer and the interconnect 11 of the first layer extend.

For the sacrificial film 41 of the second layer as well, a slimming process that reduces the width of the sacrificial film 41 is performed similarly to that of the sacrificial film 41 of the first layer; and the spacing (the width of the space) between the sacrificial film 41 of the second layer after the slimming process is widened to about 3 times the width of the sacrificial film 41 of the second layer.

Then, the sidewall film 51 of the second layer is formed conformally along the upper surface of the electrode film 23 of the second layer and the side surface and upper surface of the sacrificial film 41 of the second layer.

After forming the sidewall film 51 of the second layer, etch-back of the sidewall film 51 is performed by, for example, RIE. By the etch-back, the sidewall film 51 of the second layer is left at the sidewall and X-direction end wall of the sacrificial film 41 of the second layer as shown in FIG. 16A.

In other words, the sidewall film 51 of the second layer encloses the periphery of the sacrificial film 41 of the second layer while forming a loop at the end of the sacrificial film 41 of the second layer, and the sidewall film 51 is extending in the X direction along the sidewall of the sacrificial film 41 of the second layer.

The upper surface of the sacrificial film 41 of the second layer is exposed by the removal by the etch-back of the sidewall film 51 of the second layer deposited on the upper surface of the sacrificial film 41 of the second layer.

Figure 5A:
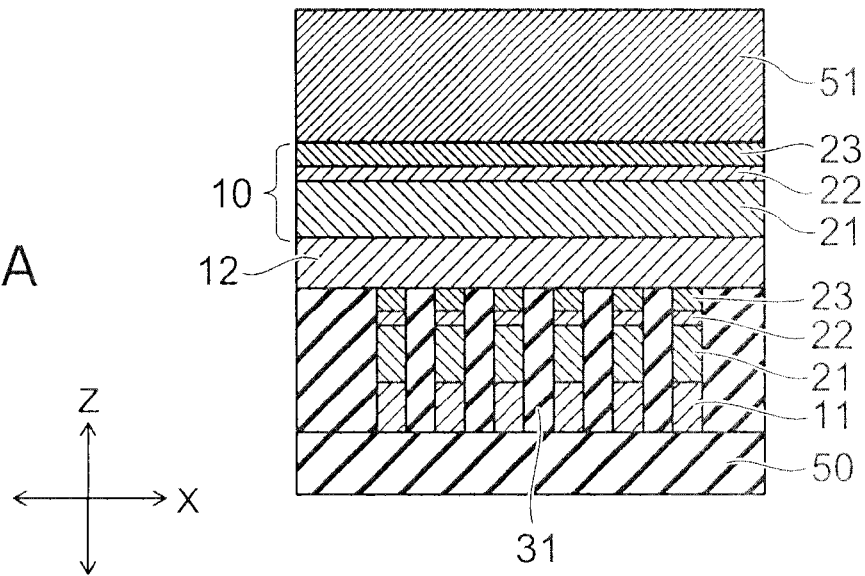
Figure 5B:
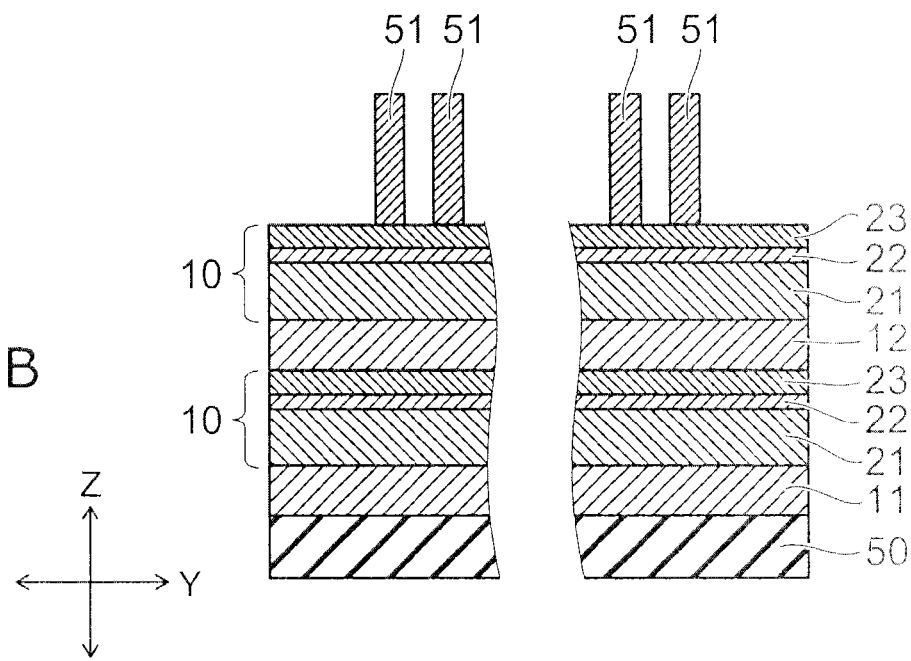
Figure 16B:
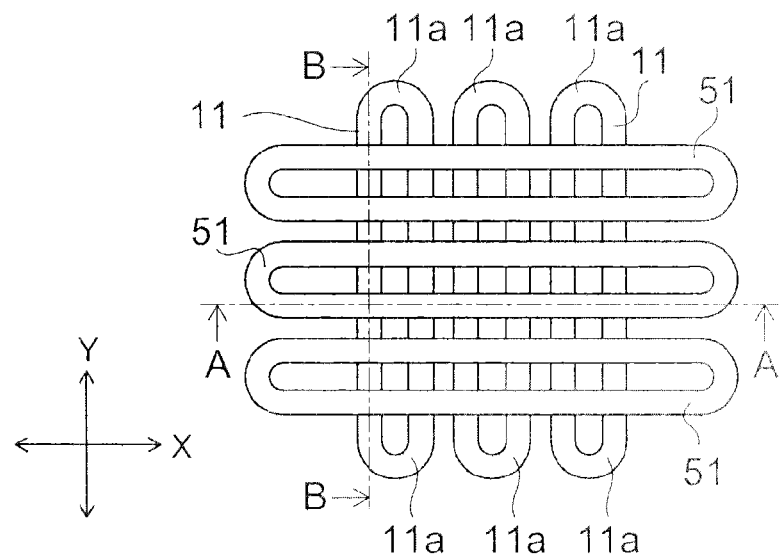

Then, for example, the sacrificial film 41 of the second layer is removed by hydrofluoric acid treatment. As shown in FIG. 16B, FIG. 5A, and FIG. 5B, the sidewall film 51 of the second layer is left on the stacked film 10 of the second layer.

FIG. 5A corresponds to the A-A cross section of FIG. 16B.

FIG. 5B corresponds to the B-B cross section of FIG. 16B.

The sidewall film 51 of the second layer extends in the X direction; and the X-direction ends of a pair of sidewall films 51 of the second layer adjacent to each other in the Y direction are linked by forming a loop. In other words, the sidewall film 51 of the second layer also is formed in a closed loop pattern.

Then, the stacked film 10 of the second layer, the interconnect 12 of the second layer, and the stacked film 10 of the first layer are etched by, for example, RIE using the sidewall film 51 of the second layer formed in the closed loop pattern as a mask.

Figure 6A:
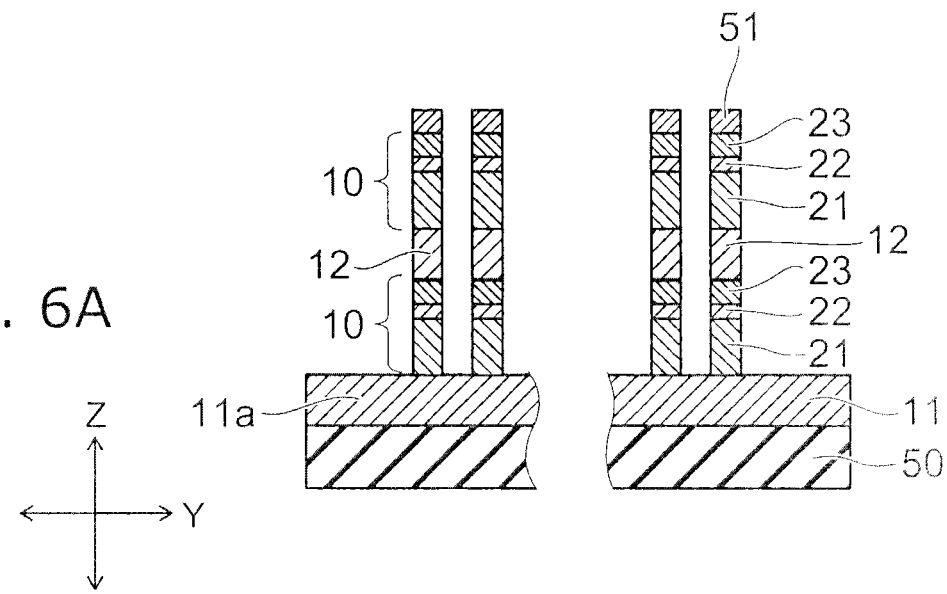

The stacked film 10 of the second layer and the interconnect 12 of the second layer are patterned into fin configurations extending in the X direction (the direction piercing the page surface in FIG. 6A).

When viewed in plan, the stacked film 10 of the second layer and the interconnect 12 of the second layer are patterned into closed loop patterns to match the closed loop pattern of the sidewall film 51 of the second layer which is the mask.

In other words, the stacked film 10 of the second layer extends in the X direction; and the X-direction ends of a pair of stacked films 10 of the second layer adjacent to each other in the Y direction are linked by forming a loop. Similarly, the interconnect 12 of the second layer extends in the X direction; and the X-direction ends of a pair of interconnects 12 adjacent to each other in the Y direction are linked by forming a loop.

In the second layer as well, the stacked film 10 and the interconnect 12 are patterned into line-and-space patterns arranged at pitches that are narrower than the pitch of the sacrificial film that has the limitations of the resolution limit of the lithography.

Further, the stacked film 10 of the first layer that is already patterned into the configuration extending in the Y direction by the etching described above using the sidewall film 51 of the first layer as the mask is patterned into a substantially columnar configuration (hereinafter, called simply a "columnar configuration") by etching using the sidewall film 51 of the second layer as a mask. In other words, the stacked film 10 of the first layer is left in a columnar configuration interposed between the interconnect 12 of the second layer extending in the X direction and the interconnect 11 of the first layer extending in the Y direction.

In the etching using the sidewall film 51 of the second layer as the mask, the portion of the inter-layer insulating film 31 of the first layer shown in FIG. 5A not formed under the sidewall film 51 of the second layer extending in the X direction also is removed.

In other words, when patterning the stacked film 10 of the first layer into the columnar configuration, the stacked film 10 of the first layer and the inter-layer insulating film 31 of the first layer that are positioned under the space between the sidewall films 51 of the second layer arranged in the Y direction and not covered with the sidewall film 51 of the second layer are simultaneously etched and removed.

The inter-layer insulating film 31 of the first layer is left between the stacked films 10 of the first layer having the columnar configurations arranged in the direction (the X direction) piercing the page surface in FIG. 6A.

Also, the interconnect 11 of the first layer is exposed by the etching removal of the stacked film 10 of the second layer, the interconnect 12 of the second layer, the stacked film 10 of the first layer, and the inter-layer insulating film 31 of the first layer using the sidewall film 51 of the second layer as a mask. The interconnect 11 of the first layer is left in the closed loop pattern configuration extending in the Y direction as shown in FIG. 16B without being removed.

Figure 6B:
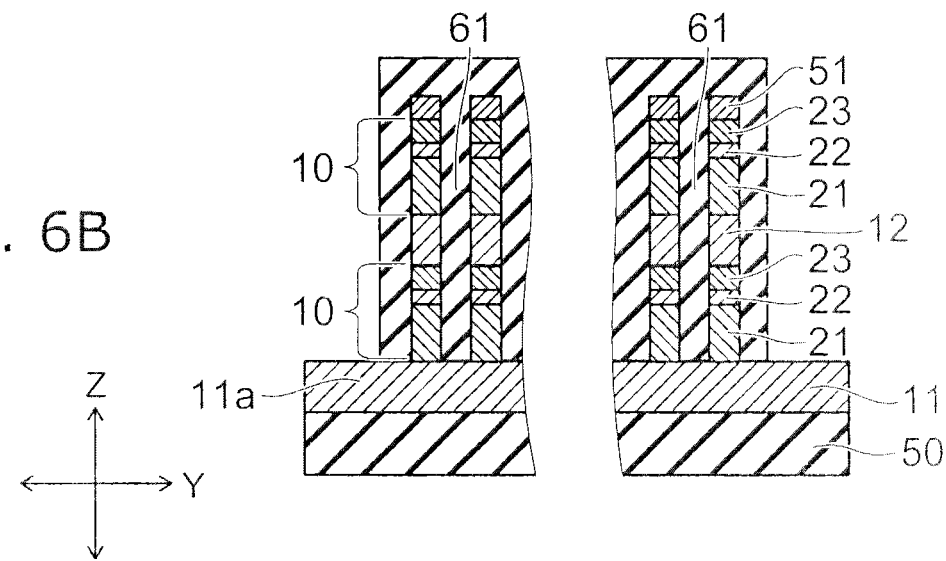
Figure 16C:
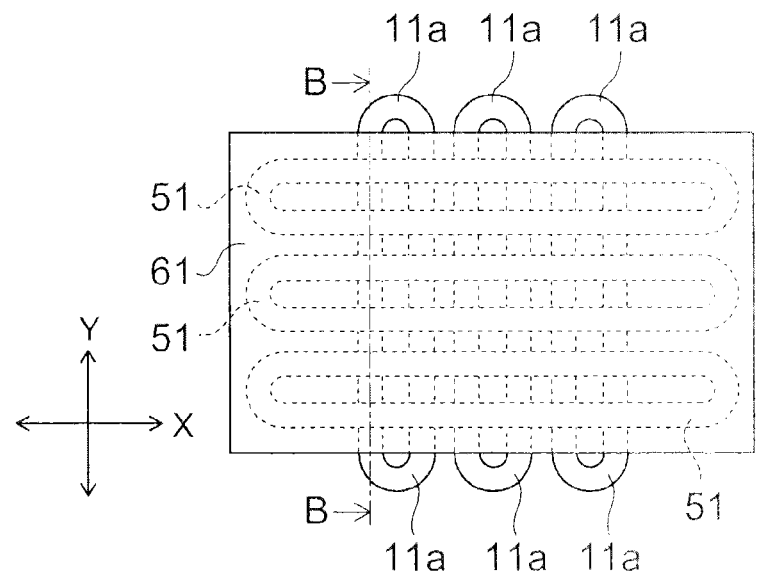

Then, as shown in FIG. 6B and FIG. 16C, a loop portion 11a of the Y-direction end portion of the interconnect 11 of the first layer that is exposed from the resist film 61 is removed in a state in which a region other than the loop portion 11a of the Y-direction end portion of the interconnect 11 of the first layer is covered with a mask film, e.g., a resist film 61.

FIG. 6B corresponds to the B-B cross section of FIG. 16C.

Figure 7A:
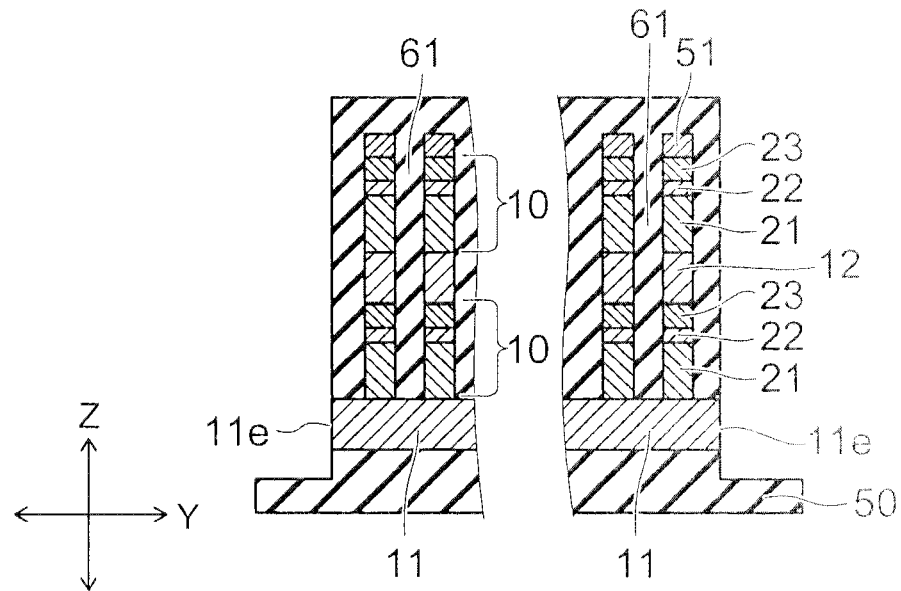
Figure 17A:
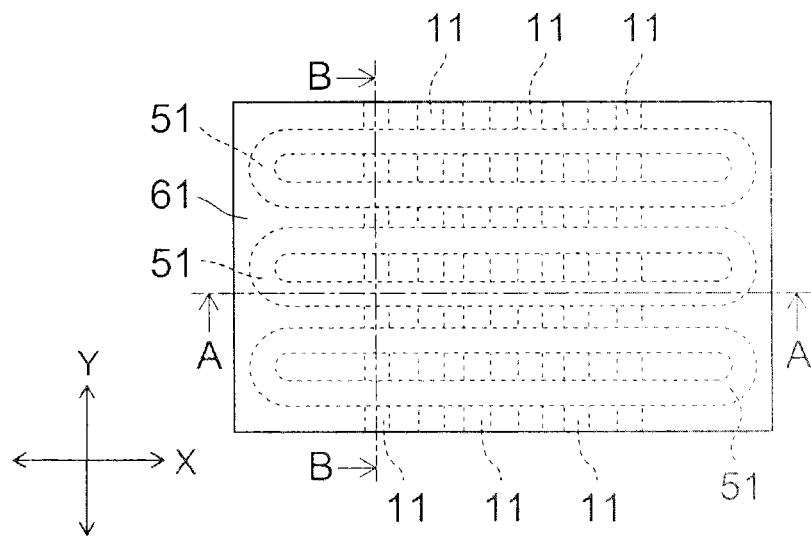

As shown in FIG. 7A and FIG. 17A, the loop portion 11a of the interconnect 11 of the first layer is removed by etching the loop portion 11a of the interconnect 11 of the first layer by, for example, RIE using the resist film 61 as a mask.

FIG. 7A corresponds to the B-B cross section of FIG. 17A.

By the removal of the loop portion 11a, the link between the interconnects 11 of the first layer adjacent to each other in the X direction is severed; and each of the interconnects 11 of the first layer becomes an independent interconnect.

According to the embodiment, after patterning the stacked film 10 of the nth layer and the interconnect 11 of the nth layer into the closed loop configurations by the nth sidewall transfer process, the interconnect 12 of the (n+1)th layer and the stacked film 10 of the (n+1)th layer are stacked on the stacked film 10 of the nth layer without performing a loop cut of the stacked film 10 of the nth layer and the interconnect 11 of the nth layer at this stage.

Then, after the interconnect 12 of the (n+1)th layer and the stacked film 10 of the (n+1)th layer have been patterned together with the stacked film 10 of the nth layer by the (n+1)th sidewall transfer process, the loop portion 11a of the interconnect 11 of the nth layer is removed.

The loop portion 11a of the interconnect 11 of the nth layer is exposed after patterning the interconnect 12 of the (n+1)th layer, the stacked film 10 of the (n+1)th layer, and the stacked film 10 of the nth layer. Accordingly, the object of removal can be only the interconnect 11 (the loop portion 11a). As a result, the loop cut of the interconnect 11 can be performed easily.

Here, comparative examples include a method for performing a loop cut of the stacked film 10 of the nth layer and the interconnect 11 of the nth layer after patterning the interconnect 11 of the nth layer and the stacked film 10 of the nth layer into the closed loop configurations and prior to stacking the interconnect 12 of the (n+1)th layer and the stacked film 10 of the (n+1)th layer.

However, in the method of such a comparative example, it is difficult to be patterning because the loop portion of the multilayered film that includes the rectifying element 21, the variable resistance film 22, and the electrode film 23 included in the interconnect 11 of the nth layer and the stacked film 10 or the nth layer is patterned.

Conversely, according to the embodiment, the components stacked on the loop portion 11a of the interconnect of the nth layer are removed simultaneously to the patterning of the stacked film 10 of the (n+1)th layer into the closed loop configuration and the patterning of the stacked film 10 of the nth layer into the columnar configuration after the (n+1)th sidewall transfer process. Therefore, when removing the loop portion 11a, only the interconnect 11 can be etched; and it is easy to be patterning.

Moreover, in the comparative example recited above, the loop cut is performed on the multilayered film recited above; and the aspect ratio (the ratio of the height to the width) is high. Therefore, in the cleaning after the sidewall transfer patterning, particularly the longitudinal-direction end portions are received to the pressure of the cleaning liquid because the longitudinal-direction end portions become outlets of the cleaning liquid; and collapsing of the multilayered film recited above at the end portions occurs easily.

According to the embodiment, the aspect ratio is lower than that of the comparative example recited above; and the collapsing in the cleaning after the patterning does not occur easily because the loop cut is performed on only the one layer of the interconnect 11.

Other comparative examples include a method in which the loop cut of the sidewall film 51 which is the mask of the sidewall transfer process is performed; and the sidewall film 51 on which the loop cut is performed is used as a mask to pattern the interconnect 11 and the stacked film 10 of the lower layer.

However, in such a case, the width of the end portion of the sidewall film 51 on which the loop cut is easily wider due to deposits during the RIE; and as a result, there is a risk that the width of the end portion of the interconnect 11 patterned using the sidewall film 51 as the mask may increase shorting between the mutually-adjacent interconnects 11.

Conversely, the embodiment does not lead to the increase of the line width of the sidewall film 51 and the line width of the interconnect 11 because the loop cut of the interconnect 11 is performed after the sidewall transfer process that uses, as the mask, the sidewall film 51 having the closed loop configuration as-is without performing the loop cut of the sidewall film 51.

The description now returns to the description of the manufacturing method. In FIG. 7A and FIG. 17A described above, the resist film 61 is removed after removing the loop portion 11a of the interconnect 11 of the nth layer (the first layer).

Figure 7B:
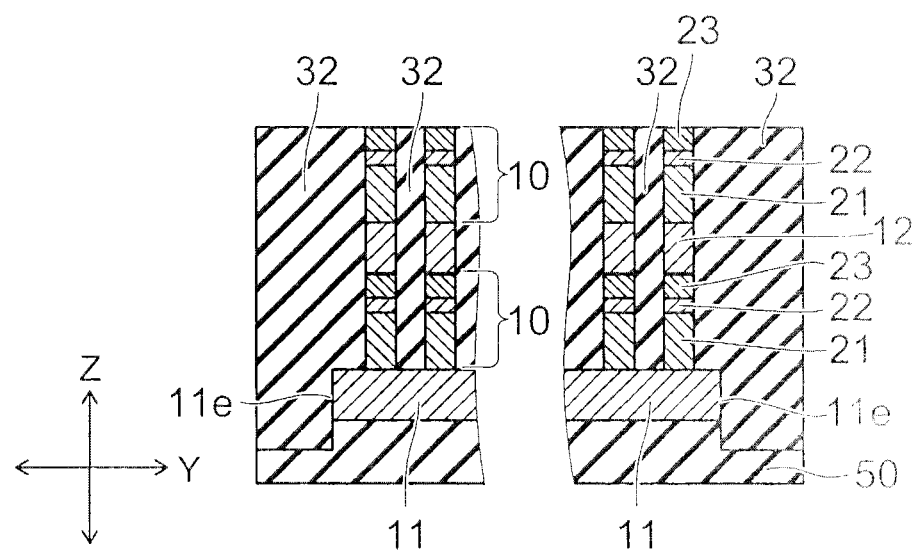

Then, as shown in FIG. 7B, an inter-layer insulating film 32 is filled into the space made by the etching using the sidewall film 51 of the second layer as the mask.

In other words, the same inter-layer insulating film 32 is formed simultaneously on the space between the stacked films 10 of the first layer adjacent to each other in the Y direction, the space between the interconnects 12 of the second layer adjacent to each other in the Y direction, the space between the stacked films 10 of the second layer adjacent to each other in the Y direction, and the portion from which the loop portion 11a of the interconnect 11 is removed. Here, prior to the formation of the inter-layer insulating film 32, for example, a silicon nitride film may be continuously formed as a protective film from the end portion 11e of the interconnect 11 to the upper surface of the interconnect 11 and the side surfaces of the stacked film 10 of the first layer, the interconnect 12, and the stacked film 10 of the second layer.

As shown in FIG. 5A, the inter-layer insulating film 31 is already filled between the stacked films 10 of the first layer that are patterned into the columnar configurations and arranged in the X direction (the direction piercing the page surface in FIG. 7B).

As shown in FIG. 7B, the inter-layer insulating film 32 covers the end portion 11e of the Y-direction end of the interconnect 11 of the first layer. In other words, according to the embodiment, the inter-layer insulating film 32 that is provided between the interconnect 12 of the second layer and the stacked film 10 of the second layer also is provided at the end portion 11e of the interconnect 11 of the first layer because the loop cut of the interconnect 11 of the first layer is performed after the sidewall transfer process of the second layer.

After the inter-layer insulating film 32 is deposited to cover the components stacked on the substrate, the inter-layer insulating film 32 is polished by CMP using the electrode film 23 of the uppermost layer of the stacked film 10 of the second layer as a stopper; and the upper surface of the inter-layer insulating film 32 is planarized. Also, the upper surface of the electrode film 23 of the second layer is exposed.

Thereafter, the processes described above are repeated according to the number of stacks of the interconnects and the stacked films 10.

Figure 8A:
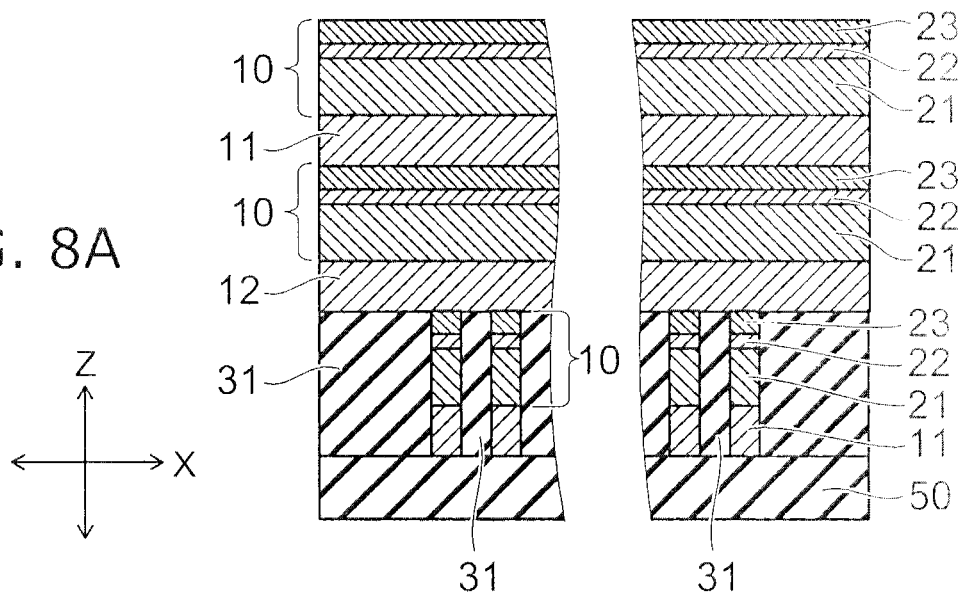

In other words, as shown in FIG. 8A, the interconnect 11 of the third layer is formed on the upper surface of the inter-layer insulating film 32 that is planarized and on the electrode film 23 that is exposed.

The stacked film 10 of the third layer is formed on the interconnect 11 of the third layer. In other words, the rectifying element 21, the variable resistance film 22, and the electrode film 23 are formed in order on the interconnect 11 of the third layer.

The sacrificial film 41 of the third layer is formed on the electrode film 23 of the uppermost layer of the stacked film 10 of the third layer. The sacrificial film 41 of the third layer is formed on the entire surface of the electrode film 23 of the third layer; and a not-shown resist film is formed on the sacrificial film 41.

The resist film is patterned by exposing and developing; and the sacrificial film 41 of the third layer is selectively etched by, for example, RIE using the patterned resist film as a mask.

Figure 17B:
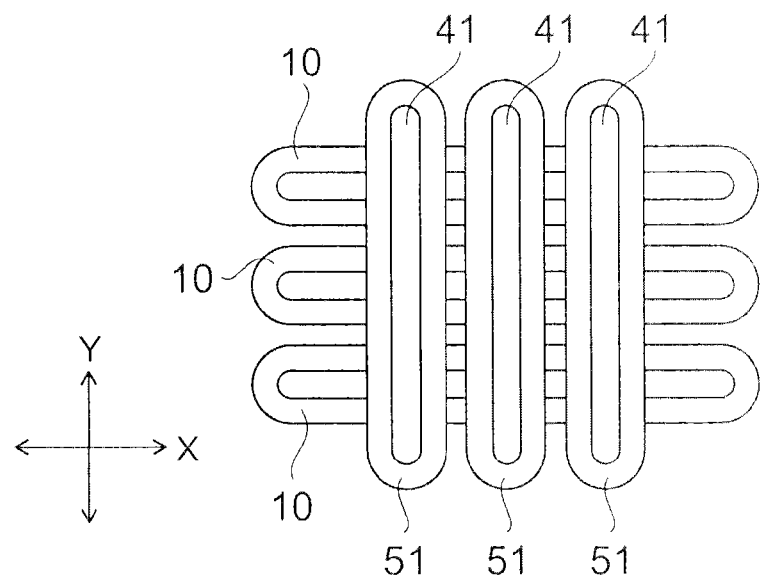

Thereby, as shown in FIG. 17B, the sacrificial film 41 of the third layer is patterned into multiple line configurations that extend in the Y direction. For the sacrificial film 41 of the third layer as well, a slimming process that reduces the width of the sacrificial film 41 is performed; and the spacing (the width of the space) between the sacrificial films 41 of the third layer after the slimming process is widened to about 3 times the width of the sacrificial film 41 of the third layer.

Then, the sidewall film 51 of the third layer is formed conformally along the upper surface of the electrode film 23 of the third layer and the side surface and upper surface of the sacrificial film 41 of the third layer.

After forming the sidewall film 51 of the third layer, etch-back of the sidewall film 51 is performed by, for example, RIE. By the etch-back, the sidewall film 51 of the third layer is left at the sidewall and Y-direction end wall of the sacrificial film 41 of the third layer as shown in FIG. 17B.

In other words, the sidewall film 51 of the third layer encloses the periphery of the sacrificial film 41 of the third layer while forming a loop at the end of the sacrificial film 41 of the third layer by extending in the Y direction along the sidewall of the sacrificial film 41 of the third layer.

The upper surface of the sacrificial film 41 of the third layer is exposed by the removal by the etch-back of the sidewall film 51 of the third layer deposited on the upper surface of the sacrificial film 41 of the third layer recited above.

Figure 8B:
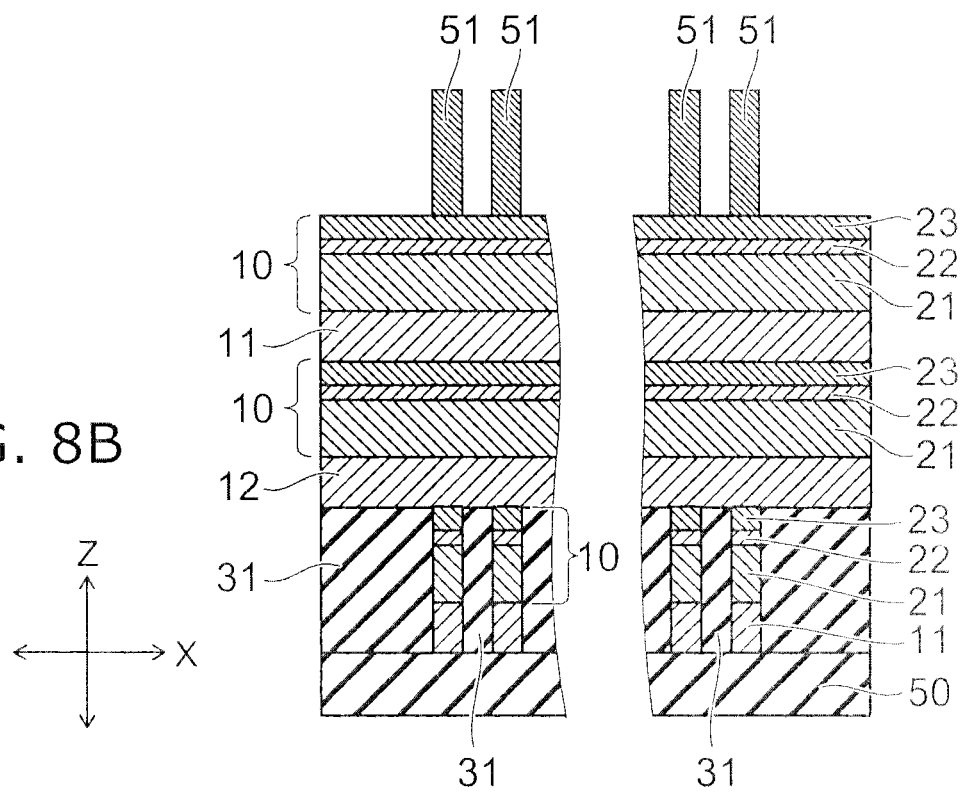
Figure 17C:
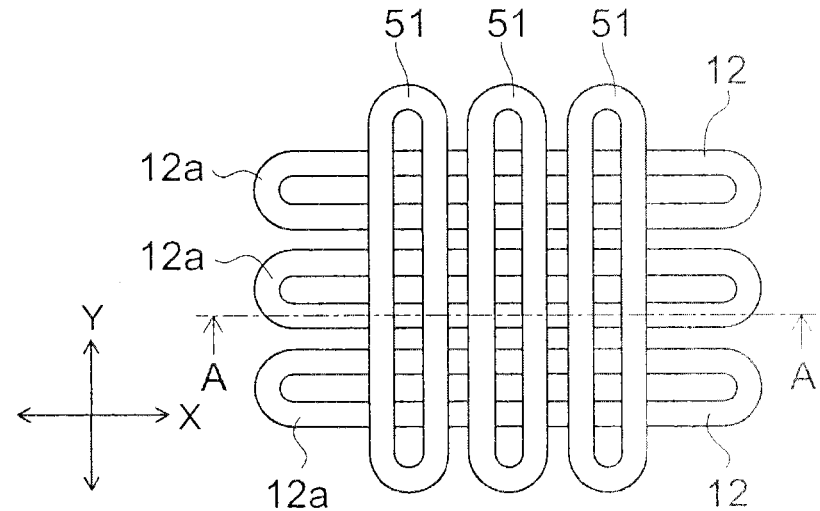

Then, the sacrificial film 41 of the third layer is removed by, for example, hydrofluoric acid treatment. As shown in FIG. 17C and FIG. 8B, the sidewall film 51 of the third layer is left on the stacked film 10 of the third layer.

FIG. 8B corresponds to the A-A cross section of FIG. 17C.

The sidewall film 51 of the third layer extends in the Y direction; and the Y-direction ends of a pair of sidewall films 51 of the third layer adjacent to each other in the X direction are linked by forming a loop. In other words, the sidewall film 51 of the third layer also is formed in a closed loop pattern.

Then, the stacked film 10 of the third layer, the interconnect 11 of the third layer, and the stacked film 10 of the second layer are etched by, for example, RIE using the sidewall film 51 of the third layer formed in the closed loop pattern as a mask.

Figure 9A:
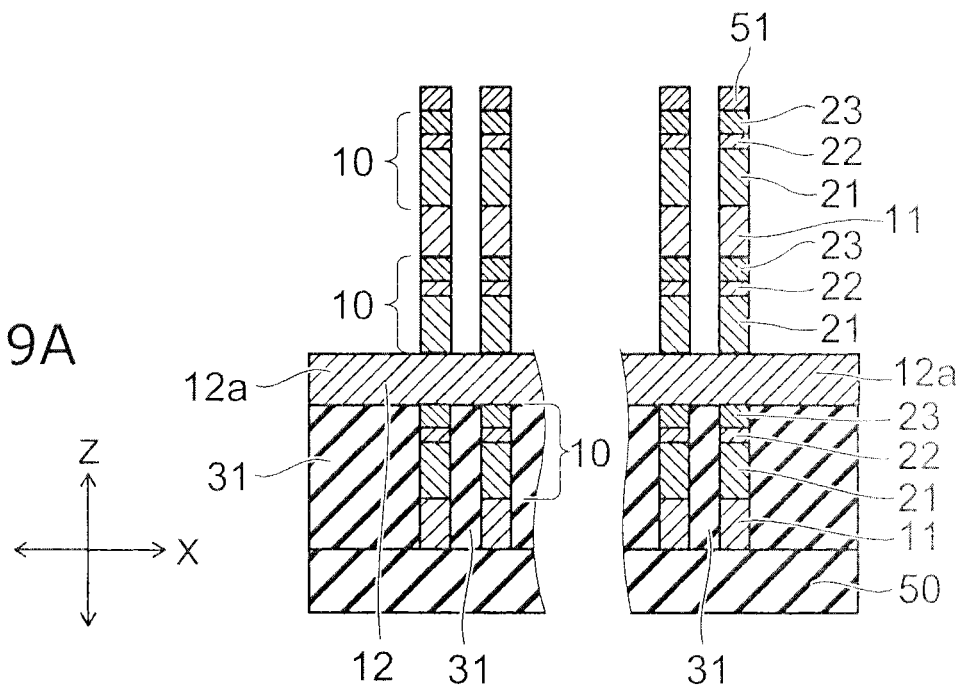

The stacked film 10 of the third layer and the interconnect 11 of the third layer are patterned into fin configurations extending in the Y direction (the direction piercing the page surface in FIG. 9A).

When viewed in plan, the stacked film 10 of the third layer and the interconnect 11 of the third layer are patterned into closed loop patterns to match the closed loop pattern of the sidewall film 51 of the third layer which is the mask.

In other words, the stacked film 10 of the third layer extends in the Y direction; and the Y-direction ends of a pair of stacked films 10 of the third layer adjacent to each other in the X direction are linked by forming a loop. Similarly, the interconnect 11 of the third layer extends in the Y direction; and the Y-direction ends of a pair of interconnects 11 adjacent to each other in the X direction are linked by forming a loop.

In the third layer as well, the stacked film 10 and the interconnect 11 are patterned into line-and-space patterns arranged at pitches that are narrower than the pitch of the sacrificial film that has the limitations of the resolution limit of the lithography.

The stacked film 10 of the second layer that is already patterned into the configuration extending in the X direction by the etching described above using the sidewall film 51 of the second layer as the mask is patterned into a columnar configuration by etching using the sidewall film 51 of the third layer as a mask. In other words, the stacked film 10 of the second layer is left in a columnar configuration interposed between the interconnect 11 of the third layer extending in the Y direction and the interconnect 12 of the second layer extending in the X direction.

In the etching using the sidewall film 51 of the third layer as the mask, the portion of the inter-layer insulating film 32 shown in FIG. 7B that is not formed under the sidewall film 51 of the third layer extending in the Y direction also is removed.

In other words, the stacked film 10 of the second layer and the inter-layer insulating film 32 that are positioned under the space between the sidewall films 51 of the third layer arranged in the X direction and not covered with the sidewall film 51 of the third layer are simultaneously etched and removed when patterning the stacked film 10 of the second layer into the columnar configuration. The inter-layer insulating film 32 is left between the stacked films 10 of the second layer having the columnar configurations arranged in the direction (the Y direction) piercing the page surface in FIG. 9A.

Further, the interconnect 12 of the second layer is exposed by the etching removal of the stacked film 10 of the third layer, the interconnect 11 of the third layer, the stacked film 10 of the second layer, and the inter-layer insulating film 32 using the sidewall film 51 of the third layer as the mask. The interconnect 12 of the second layer is left in a closed loop pattern configuration extending in the X direction as shown in FIG. 17C without being removed.

Figure 9B:
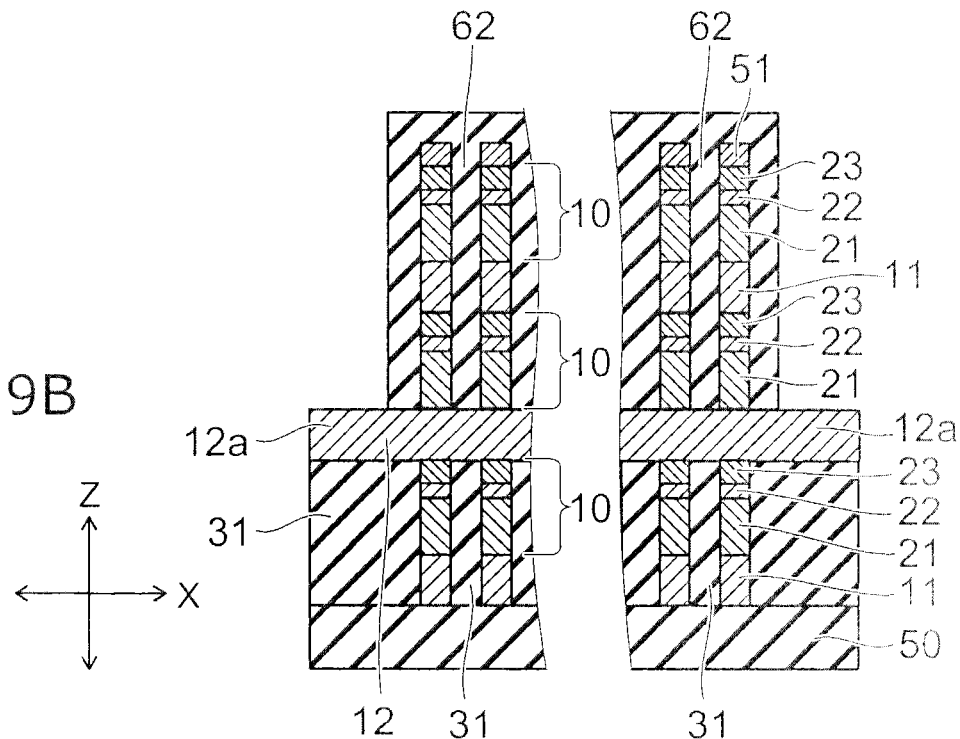
Figure 18A:
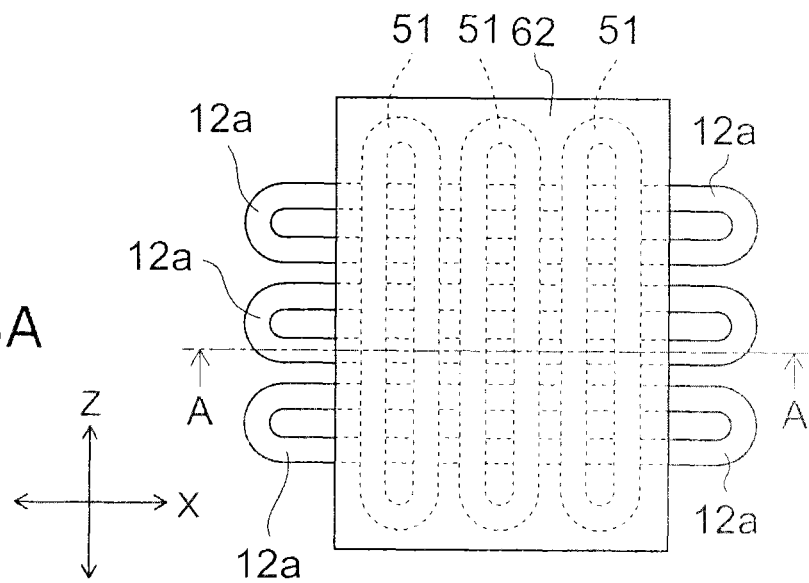

Then, as shown in FIG. 9B and FIG. 18A, a loop portion 12a of the X-direction end portion of the interconnect 12 of the second layer that is exposed from the resist film 62 is removed in a state in which a region other than the loop portion 12a of the X-direction end portion of the interconnect 12 of the second layer is covered with a mask film, e.g., a resist film 62.

FIG. 9B corresponds to the A-A cross section of FIG. 18A.

Figure 18B:
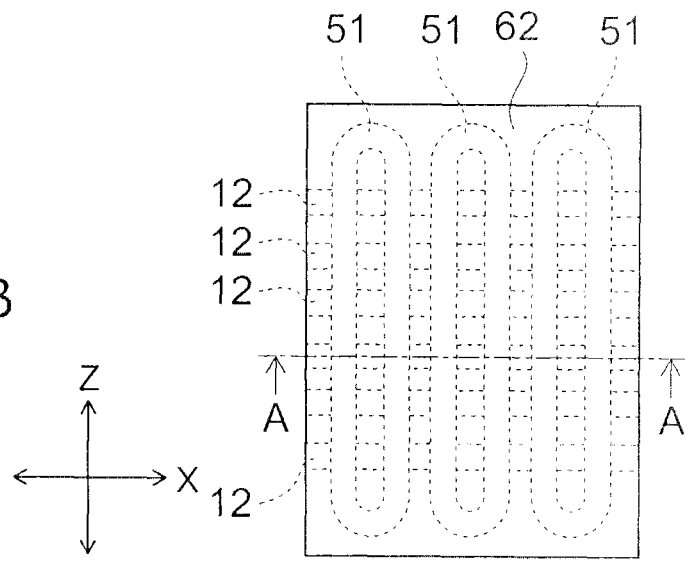

For example, as shown in FIG. 10A and FIG. 18B, the loop portion 12a of the interconnect 12 of the second layer is removed by etching the loop portion 12a of the interconnect 12 of the second layer by RIE using the resist film 62 as a mask.

FIG. 10A corresponds to the A-A cross section of FIG. 18B.

By the removal of the loop portion 12a, the link between the interconnects 12 of the second layer adjacent to each other in the Y direction is severed; and each of the interconnects 12 of the second layer becomes an independent interconnect.

According to the embodiment, the loop portion 12a of the interconnect 12 of the second layer is removed after the interconnect 11 of the third layer and the stacked film 10 of the third layer have been patterned together with the stacked film 10 of the second layer.

The loop portion 12a of the interconnect 12 of the second layer is exposed after patterning the interconnect 11 of the third layer, the stacked film 10 of the third layer, and the stacked film 10 of the second layer. Accordingly, the object of removal can be only the interconnect 12; and the loop cut of the interconnect 12 can be performed easily.

The aspect ratio is lower than that of the comparative example described above and the collapsing in the cleaning after the patterning does not occur easily because the layers on which the loop cut is performed are only the one layer of the interconnect 12.

Further, the embodiment does not lead to the increase of the line width of the sidewall film 51 and the line width of the interconnect 12 because the loop cut of the interconnect 12 is performed after the sidewall transfer process that uses, as the mask, the sidewall film 51 having the closed loop configuration as-is without performing the loop cut of the sidewall film 51.

The resist film 62 is removed after removing the loop portion 12a of the interconnect 12 of the second layer.

Then, as shown in FIG. 10B, an inter-layer insulating film 33 is filled into the space made by the etching using the sidewall film 51 of the third layer as the mask.

In other words, the same inter-layer insulating film 33 is formed simultaneously in the space between the stacked films 10 of the second layer adjacent to each other in the X direction, in the space between the interconnects 11 of the third layer adjacent to each other in the X direction, in the space between the stacked films 10 of the third layer adjacent to each other in the X direction, and on the portion from which the loop portion 12a of the interconnect 12 is removed.

As shown in FIG. 7B, the inter-layer insulating film 32 is already filled between the stacked films 10 of the second layer that are patterned into the columnar configurations and arranged in the Y direction (the direction piercing the page surface in FIG. 10B).

As shown in FIG. 10B, the inter-layer insulating film 33 covers the end portion 12e of the X-direction end of the interconnect 12 of the second layer. In other words, according to the embodiment, the inter-layer insulating film 33 that is provided between the interconnects 11 of the third layer and between the stacked films 10 of the third layer also is provided at the end portion 12e of the interconnect 12 of the second layer because the loop cut of the interconnect 12 of the second layer is performed after the sidewall transfer process of the third layer.

After the inter-layer insulating film 33 is deposited to cover the components stacked on the substrate, the inter-layer insulating film 33 is polished by CMP using the electrode film 23 of the uppermost layer of the stacked film 10 of the third layer as a stopper; and the upper surface of the inter-layer insulating film 33 is planarized. Also, the upper surface of the electrode film 23 of the third layer is exposed.

Thereafter, the processes are repeated for the fourth layer, the fifth layer, ..., according to the number of layers that is necessary.

Figure 11A:
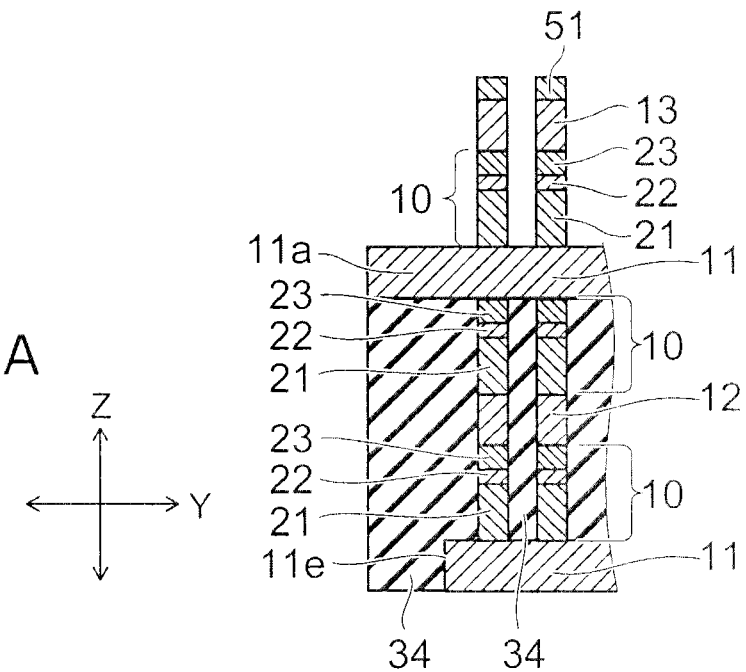
Figure 11B:
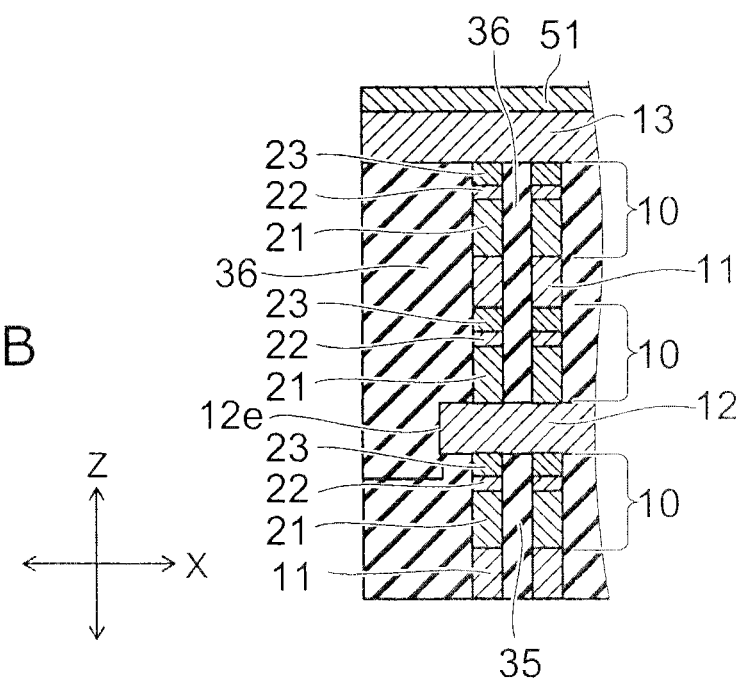
Figure 19A:
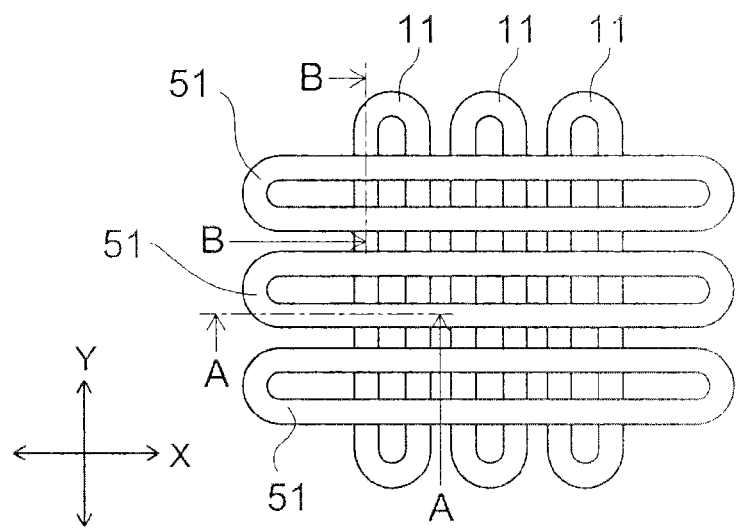

Here, FIG. 11A, FIG. 11B, and FIG. 19A show the state after the stacked film 10 of the uppermost layer and the interconnect 13 of the uppermost layer formed on the stacked film 10 of the uppermost layer are patterned by the etching using the sidewall film 51 of the uppermost layer as the mask.

FIG. 11A corresponds to the B-B cross section of FIG. 19A.

FIG. 11B corresponds to the A-A cross section of FIG. 19A.

The interconnect 13 of the uppermost layer is patterned into a line configuration extending in the X direction which is orthogonal to the Y direction in which the interconnect 11 of the second layer from the top extends. When viewed in plan, the interconnect 13 of the uppermost layer is patterned into a closed loop pattern to match the closed loop pattern of the sidewall film 51 of the uppermost layer which is the mask.

Further, the stacked film 10 of the uppermost layer that is already patterned into the fin configuration extending in the Y direction by the sidewall transfer process one previous is patterned into a columnar configuration by etching using the sidewall film 51 of the uppermost layer as a mask. In other words, the stacked film 10 of the uppermost layer is left in a columnar configuration interposed between the interconnect 13 of the uppermost layer extending in the X direction and the interconnect 11 of the second layer from the top extending in the Y direction.

In the etching using the sidewall film 51 of the uppermost layer as the mask as well, the stacked film 10 of the uppermost layer and the inter-layer insulating film 36 (FIG. 11B) between the stacked films 10 of the uppermost layer arranged in the X direction that are positioned under the space between the sidewall films 51 of the uppermost layer arranged in the Y direction and not covered with the sidewall film 51 of the uppermost layer are simultaneously etched and removed when patterning the stacked film 10 of the uppermost layer into the columnar configuration.

The interconnect 11 of the second layer from the top is exposed by the etching removal of the interconnect 13 of the uppermost layer, the stacked film 10 of the uppermost layer, and the inter-layer insulating film 36 using the sidewall film 51 of the uppermost layer as a mask. The interconnect 11 of the second layer from the top is left in a closed loop pattern configuration extending in the Y direction as shown in FIG. 19A without being removed.

Figure 12A:
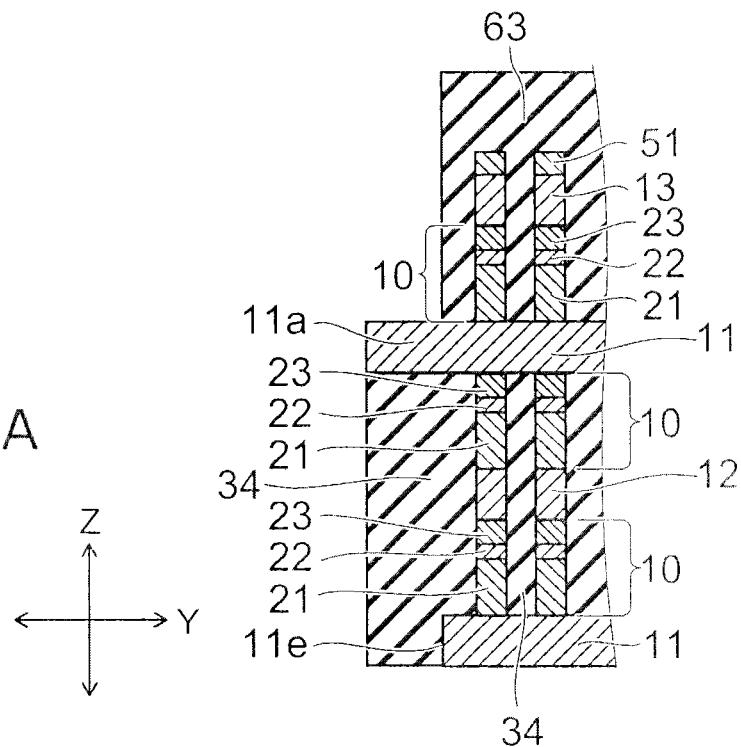
Figure 12B:
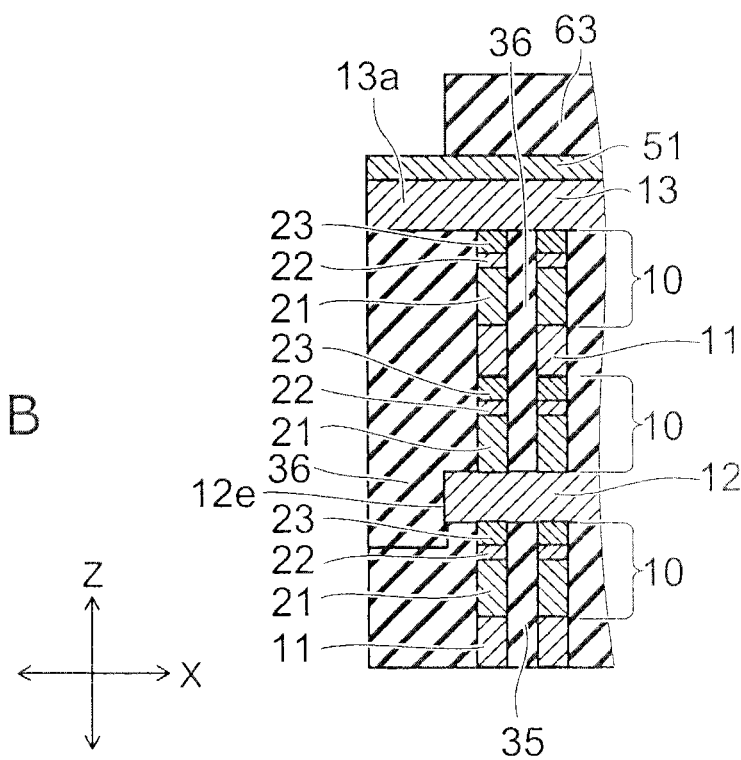
Figure 19B:
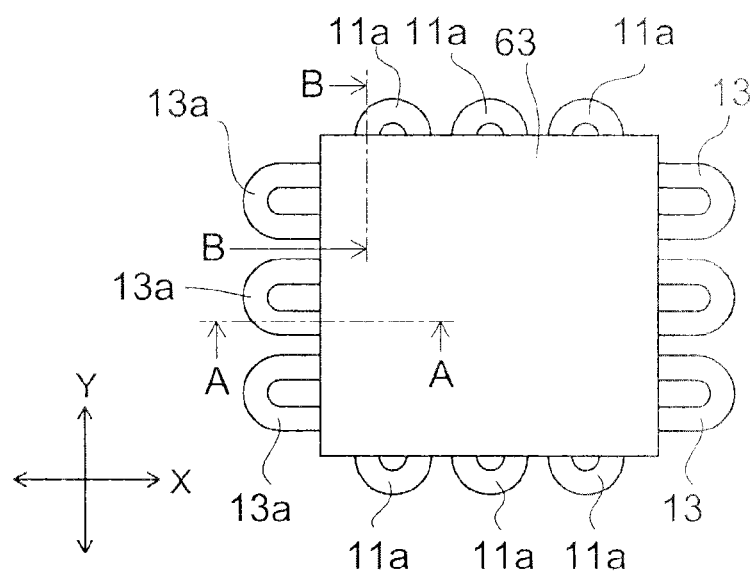

Then, as shown in FIG. 12A, FIG. 12B, and FIG. 19B, a loop portion 13a of the interconnect 13 of the uppermost layer and the loop portion 11a of the interconnect 11 of the second layer from the top that are exposed from the resist film 63 are removed in a state in which a region other than the loop portion 11a of the Y-direction end portion of the interconnect 11 of the second layer from the top and the loop portion 13a of the X-direction end portion of the interconnect 13 of the uppermost layer are covered with a mask film, e.g., a resist film 63.

FIG. 12A corresponds to the B-B cross section of FIG. 19B.

FIG. 12B corresponds to the A-A cross section of FIG. 19B.

Figure 13A:
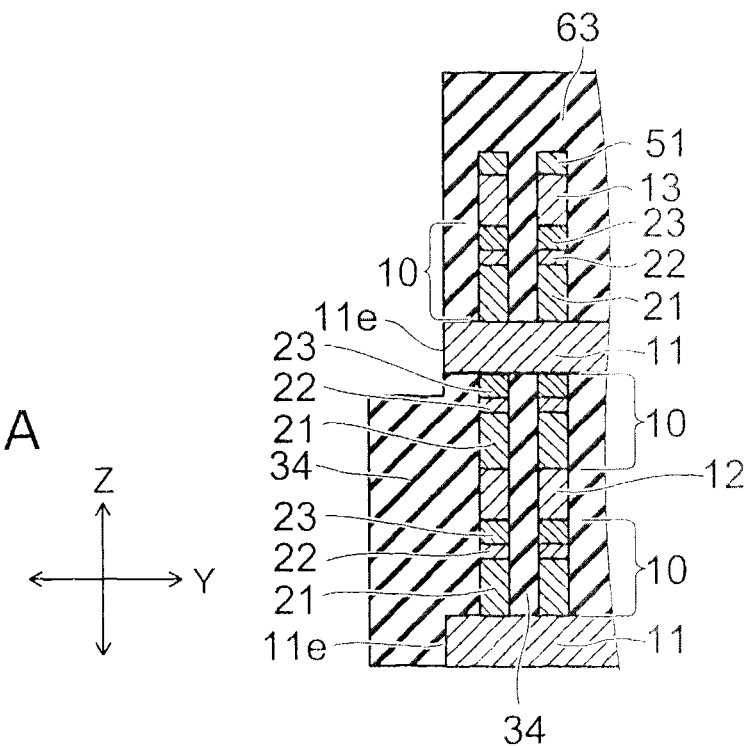
Figure 13B:
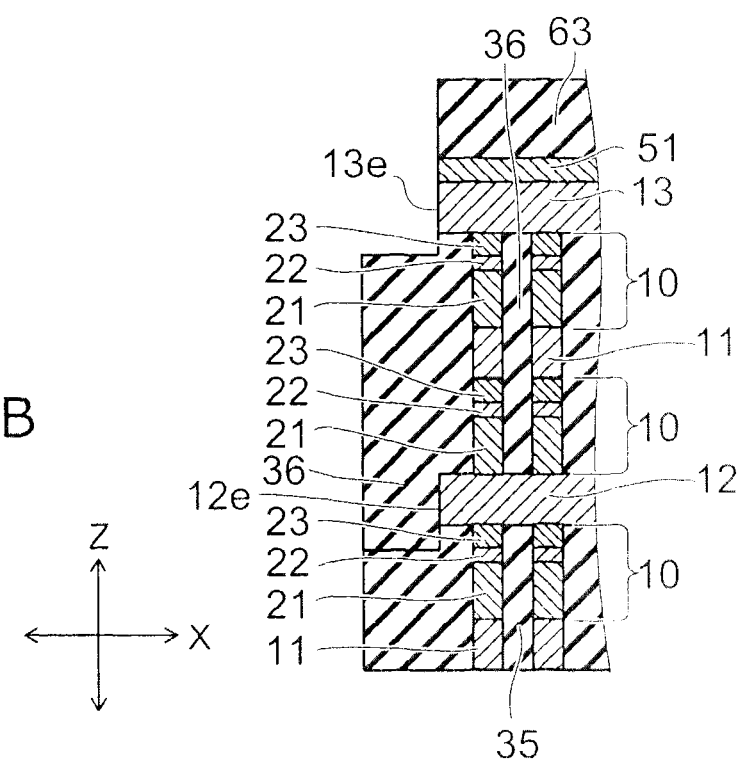
Figure 19C:
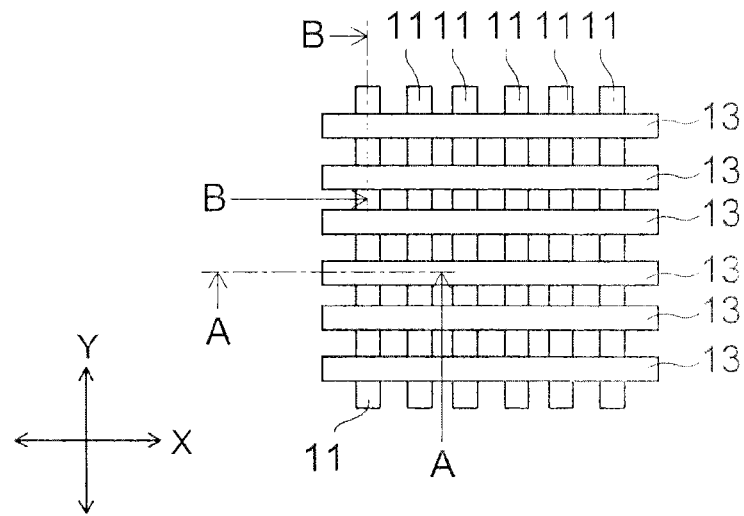

As shown in FIG. 13A, FIG. 13B, and FIG. 19C, the loop portion 13a of the interconnect 13 of the uppermost layer and the loop portion 11a of the interconnect 11 of the second layer from the top are removed simultaneously by simultaneously etching the loop portion 13a of the interconnect 13 of the uppermost layer and the loop portion 11a of the interconnect 11 of the second layer from the top by, for example, RIE using the resist film 63 as a mask.

FIG. 13A corresponds to the B-B cross section of FIG. 19C.

FIG. 13B corresponds to the A-A cross section of FIG. 19C.

By the removal of the loop portion 11a of the interconnect 11 of the second layer from the top, the link between the interconnects 11 adjacent to each other in the X direction is severed; and each of the interconnects 11 of the second layer from the top becomes an independent interconnect.

According to the embodiment, the loop portion 11a of the interconnect 11 of the second layer from the top is removed after patterning the interconnect 13 of the uppermost layer and the stacked film 10 of the uppermost layer. The loop portion 11a of the interconnect 11 of the second layer from the top is exposed after patterning the interconnect 13 of the uppermost layer and the stacked film 10 of the uppermost layer. Accordingly, the object of removal can be only the interconnect 11; and the loop cut of the interconnect 11 can be performed easily.

Further, by the removal of the loop portion 13a of the interconnect 13 of the uppermost layer, the link between the interconnects 13 adjacent to each other in the Y direction is severed; and each of the interconnects 13 of the uppermost layer becomes an independent interconnect.

According to the embodiment, the number of processes can be reduced by simultaneously removing the loop portion 13a of the interconnect 13 of the uppermost layer and the loop portion 11a of the interconnect 11 of the second layer from the top by the same etching process.

The resist film 63 is removed after removing the loop portion 13a of the interconnect 13 of the uppermost layer and the loop portion 11a of the interconnect 11 of the second layer from the top.

Then, as shown in FIG. 14A and FIG. 14B, the inter-layer insulating film 37 is filled into the space made by the etching using the sidewall film 51 of the uppermost layer as a mask.

In other words, the same inter-layer insulating film 37 is formed simultaneously in the space between the interconnects 13 of the uppermost layer adjacent to each other in the Y direction, in the space between the stacked films 10 of the uppermost layer adjacent to each other in the Y direction, on the portion from which the loop portion 11a of the interconnect 11 of the second layer from the top is removed, and on the portion from which the loop portion 13a of the interconnect 13 of the uppermost layer is removed.

As shown in FIG. 14B, the inter-layer insulating film 36 is already filled between the stacked films 10 of the uppermost layer that are patterned into the columnar configurations and arranged in the X direction.

As shown in FIG. 14A, the inter-layer insulating film 37 covers the end portion 11e of the Y-direction end of the interconnect 11 of the second layer from the top. In other words, the inter-layer insulating film 37 that is provided between the interconnects 13 of the uppermost layer and between the stacked films 10 of the uppermost layer also is provided at the end portion 11e of the interconnect 11 of the second layer from the top.

As shown in FIG. 14B, the inter-layer insulating film 37 also is provided at the end portion 13e of the X-direction end of the interconnect 13 of the uppermost layer.

A method for manufacturing a semiconductor memory device according to a second embodiment will now be described with reference to FIG. 20A to FIG. 23B.

The processes up to the process shown in FIG. 6A are performed similarly to those of the first embodiment recited above.

Figure 20A:
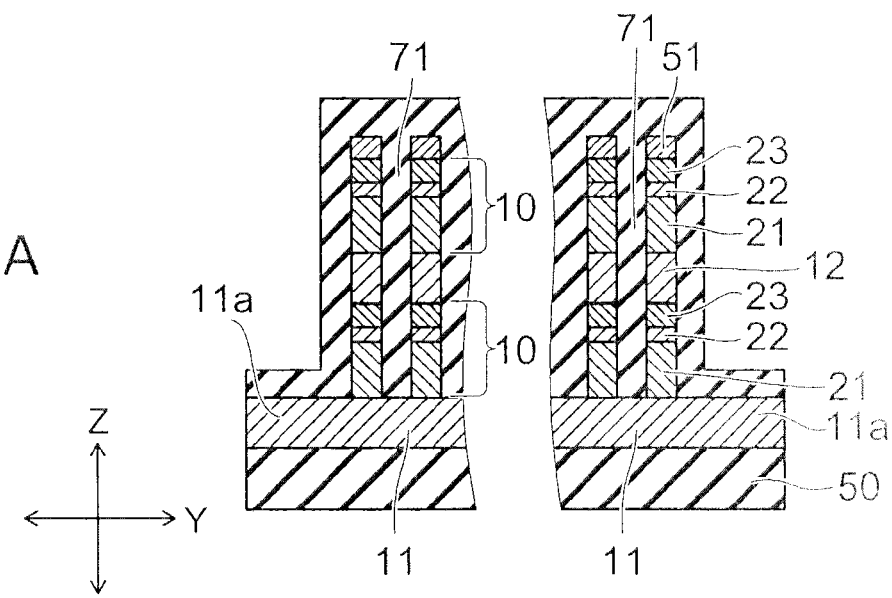
FIGS. 20A to 27B are schematic cross-sectional views showing an example of a method for manufacturing the semiconductor memory device of a second embodiment.

Then, in the second embodiment, after the loop portion 11a of the interconnect 11 of the first layer is exposed by the second sidewall transfer, the stacked film 10 of the second layer and the space between the stacked films 10 of the second layer are covered with a cell unit insulating film (an inter-layer insulating film) 71 as shown in FIG. 20A. Prior to covering the space between the stacked films 10 with the cell unit insulating film 71, for example, a silicon nitride film may be continuously formed as a protective film at the side surfaces of the stacked film 10 and the interconnect 12 of the first layer, the stacked film 10 of the second layer, and the sidewall film 51.

The cell unit insulating film 71 covers the cell array region where the stacked films 10 are formed. The cell unit insulating film 71 is filled into the space between the stacked bodies including the stacked films 10. Or, the cell unit insulating film 71 closes the top of the space while making a gap in the space between the stacked bodies including the stacked films 10. The cell unit insulating film 71 is formed to thinly cover the surface of the loop portion 11a of the interconnect 11 of the first layer and does not fill the space above the loop portion 11a. For example, in the case where the gap is not left in the space between the stacked bodies, the film thickness of the cell unit insulating film 71 formed on the loop portion 11a is thinner than the film thickness of the cell unit insulating film 71 formed in the space between the stacked bodies in Z direction.

Figure 20B:
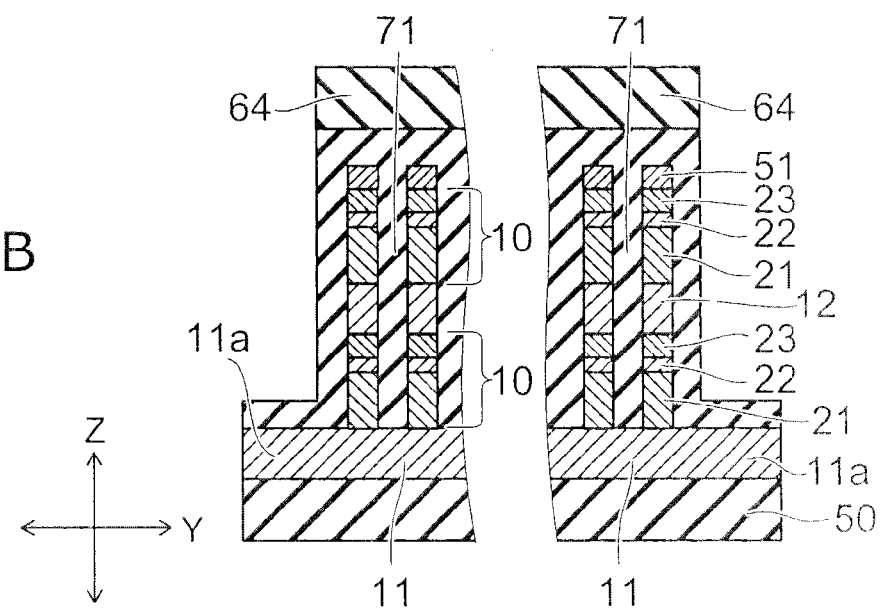

Subsequently, as shown in FIG. 20B, a mask film, e.g., a resist film 64, is formed on the cell unit insulating film 71 in the cell array region; and the portion exposed from the resist film 64 is etched using the resist film 64 as a mask.

Figure 21A:
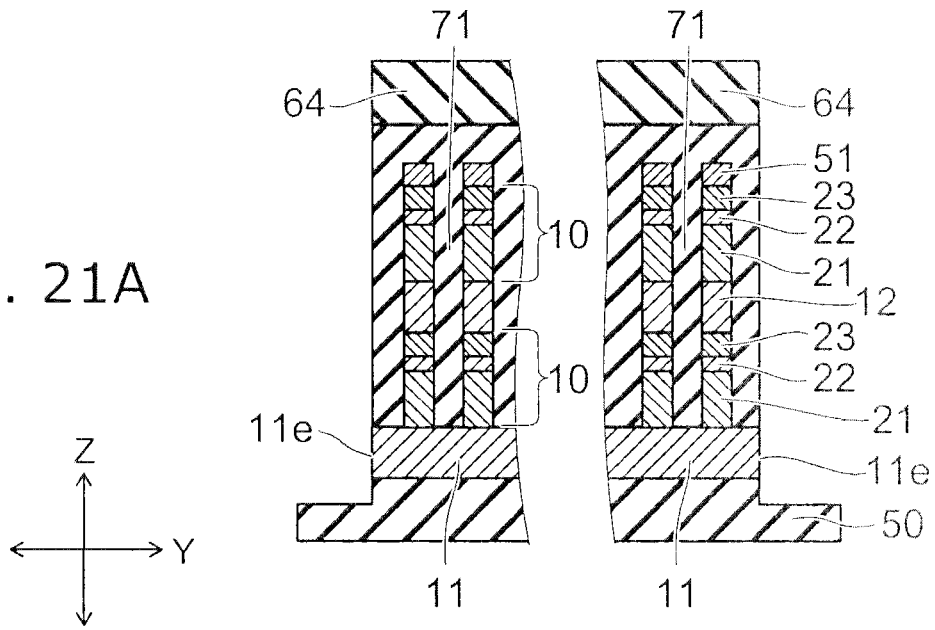

The loop portion 11a of the interconnect 11 of the first layer is etched by, for example, RIE using the resist film 64 as a mask; and the loop portion 11a of the interconnect 11 of the first layer is removed as shown in FIG. 21A.

In the embodiment as well, the loop portion 11a can be removed easily because the loop cut is performed on only the one layer of the interconnect 11.

The resist film 64 is removed after removing the loop portion 11a.

Figure 21B:
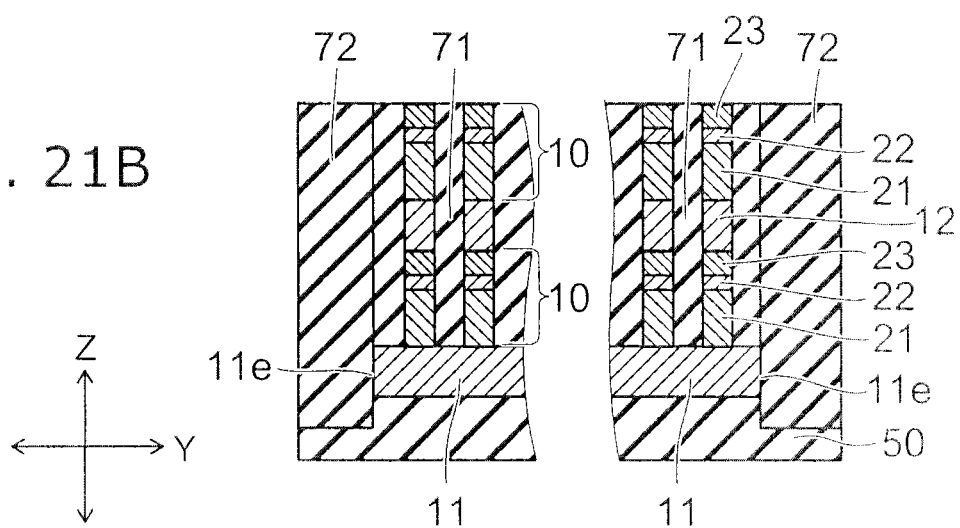

According to the second embodiment, the resist film (34 can be prevented from entering the cell unit because the resist film 64 used to form the mask of the loop cut is formed after covering the cell array region with the cell unit insulating film 71. Therefore, the cell unit can be protected from oxidization of the cell unit due to, for example, the asher when removing the resist film 64 and the effects of the cleaning (collapse of the cell unit, etc.) after the loop cut patterning. After removing the resist film 64, an end portion insulating film (an inter-layer insulating film) 72 is formed on the portion from which the loop portion 11a of the interconnect 11 is removed as shown in FIG. 21B. The end portion insulating film 72 covers the end portion 11e of the Y-direction end of the interconnect 11 of the first layer. The upper surface of the cell unit insulating film 71 and the upper surface of the end portion insulating film 72 are polished by CMP using the electrode film 23 of the uppermost layer of the stacked film 10 of the second layer as a stopper; and the upper surface of the cell unit insulating film 71 and the upper surface of the end portion insulating film 72 are planarized. Also, the upper surface of the electrode film 23 of the second layer is exposed.

Then, the interconnect 11 of the third layer is formed on the upper surface of the cell unit insulating film 71 and the upper surface of the end portion insulating film 72 that are pla- narized and on the electrode film 23 that is exposed. The stacked film 10 of the third layer is formed on the interconnect 11 of the third layer.

The processes up to the process shown in FIG. 9A are performed similarly to those of the first embodiment.

Figure 22A:
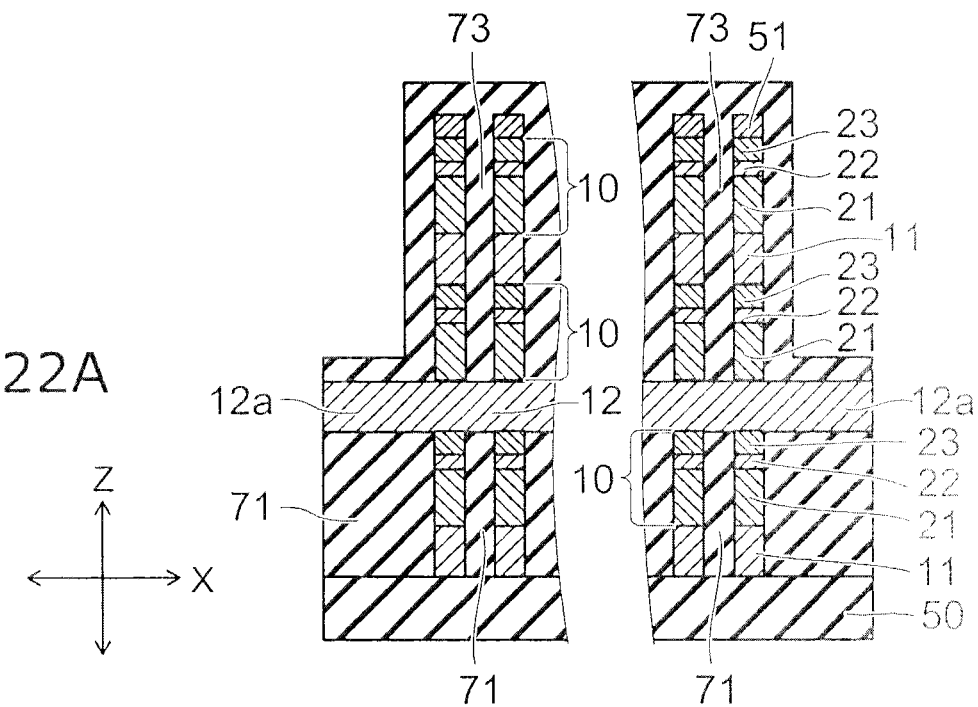
Figure 29A:
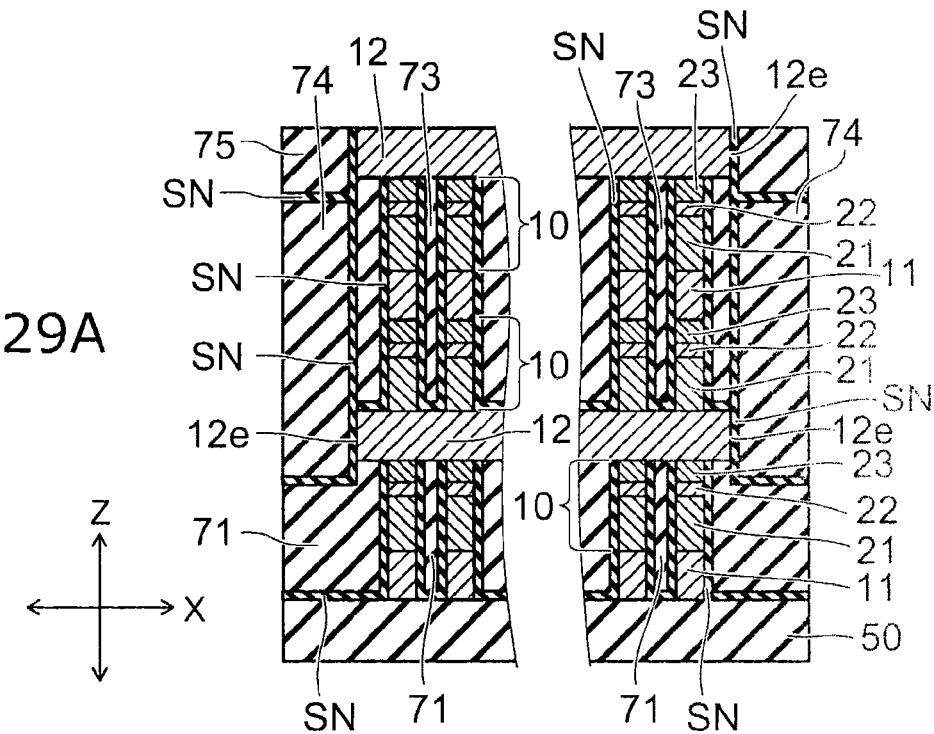
FIGS. 29A to 29B are schematic cross-sectional views showing an example of the method for manufacturing the semiconductor memory device of the second embodiment.
Figure 29B:
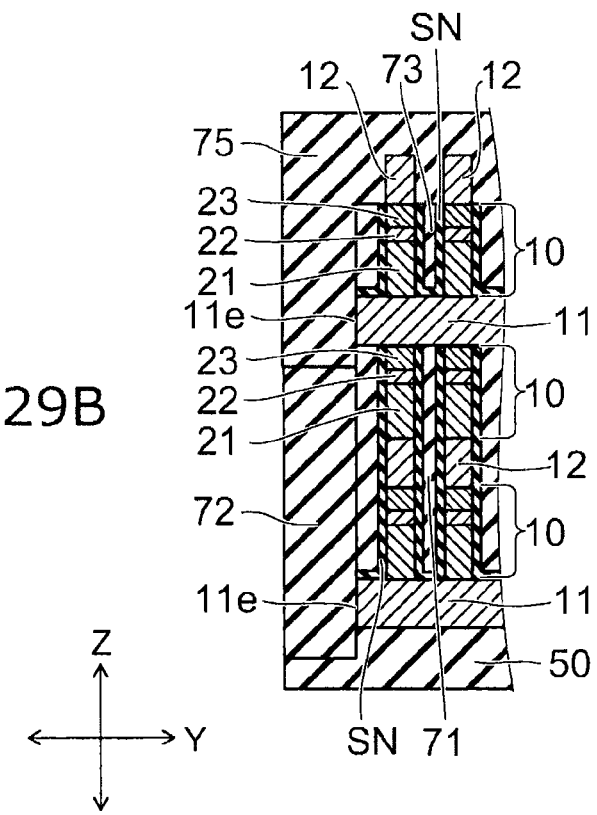

Then, in the second embodiment, the stacked film 10 of the third layer and the space between the stacked films 10 of the third layer are covered with a cell unit insulating film (an inter-layer insulating film) 73 as shown in FIG. 22A after the loop portion 12a of the interconnect 12 of the second layer is exposed by the third sidewall transfer. Prior to covering the space between the stacked films 10 with the cell unit insulating film 73, for example, a silicon nitride film SN may be continuously formed as a protective film at the side surfaces of the stacked film 10 and the interconnect 11 of the second layer, the stacked film 10 of the third layer, and the sidewall film 51 (final structure is ref. FIGS. 29A and 29B).

The cell unit insulating film 73 covers the cell array region where the stacked films 10 are formed. The cell unit insulating film 73 is filled into the space between the stacked bodies including the stacked films 10. Or, the cell unit insulating film 73 closes the top of the space while making a gap in the space between the stacked bodies including the stacked films 10. The cell unit insulating film 73 is formed to thinly cover the surface of the loop portion 12a of the interconnect 12 of the second layer and does not fill the space above the loop portion 12a.

Figure 22B:
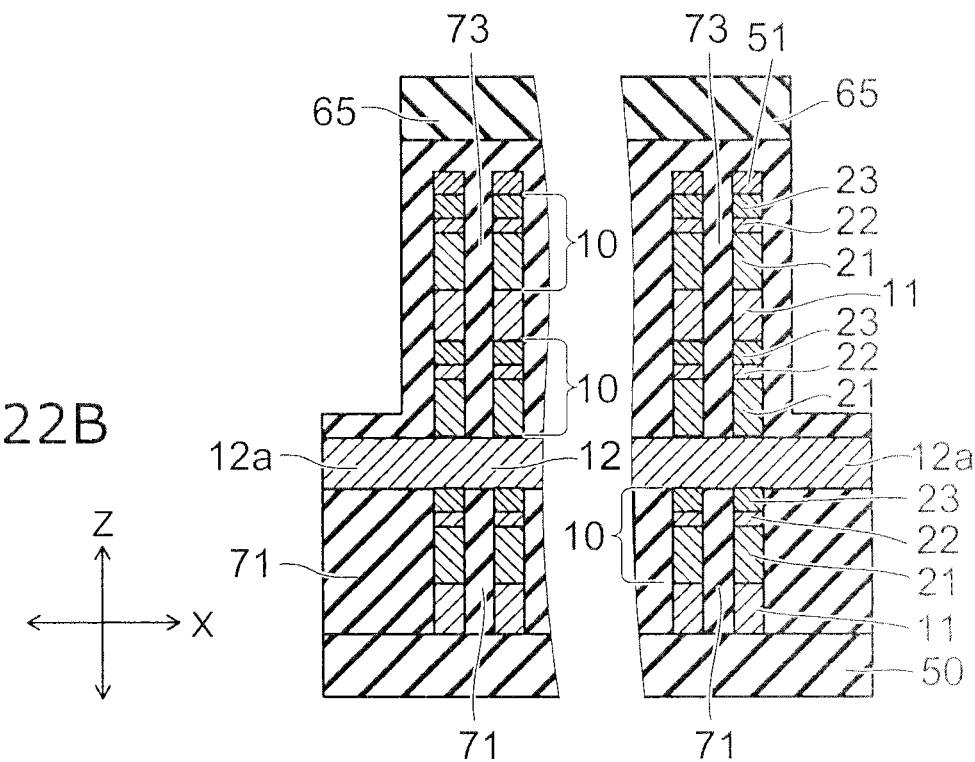

Subsequently, as shown in FIG. 22B, a mask film, e.g., a resist film 65, is formed on the cell unit insulating film 73 in the cell array region; and the portion exposed from the resist film 65 is etched using the resist film 65 as a mask.

Figure 23A:
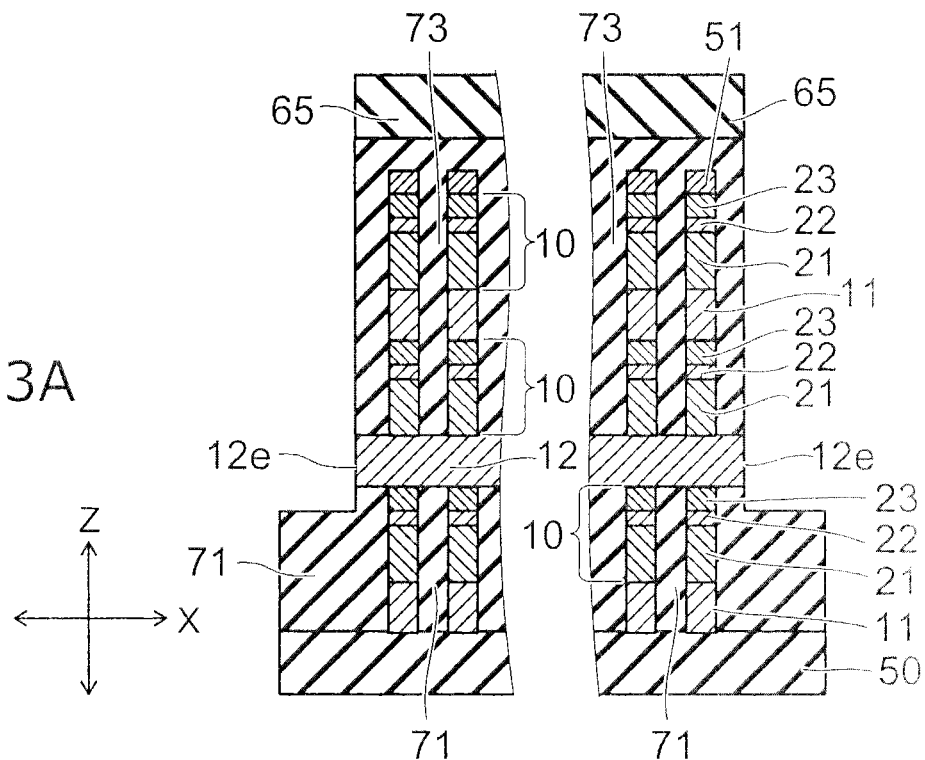

The loop portion 12a of the interconnect 12 of the second layer is etched by, for example, RIE using the resist film 65 as a mask; and the loop portion 12a of the interconnect 12 of the second layer is removed as shown in FIG. 23A. In such a case as well, the loop portion 12a can be removed easily because the layers on which the loop cut is performed are only the one layer of the interconnect 12.

The resist film 65 is removed after removing the loop portion 12a.

According to the second embodiment, the resist film 65 can be prevented from entering the cell unit because the resist film 65 that is used to form the mask of the loop cut is formed after covering the cell array region with the cell unit insulating film 73. Therefore, the cell unit can be protected from the oxidization of the cell unit due to, for example, the asher when removing the resist film 65 and the effects of the cleaning (the collapse of the cell unit, etc.) after the loop cut patterning.

Figure 23B:
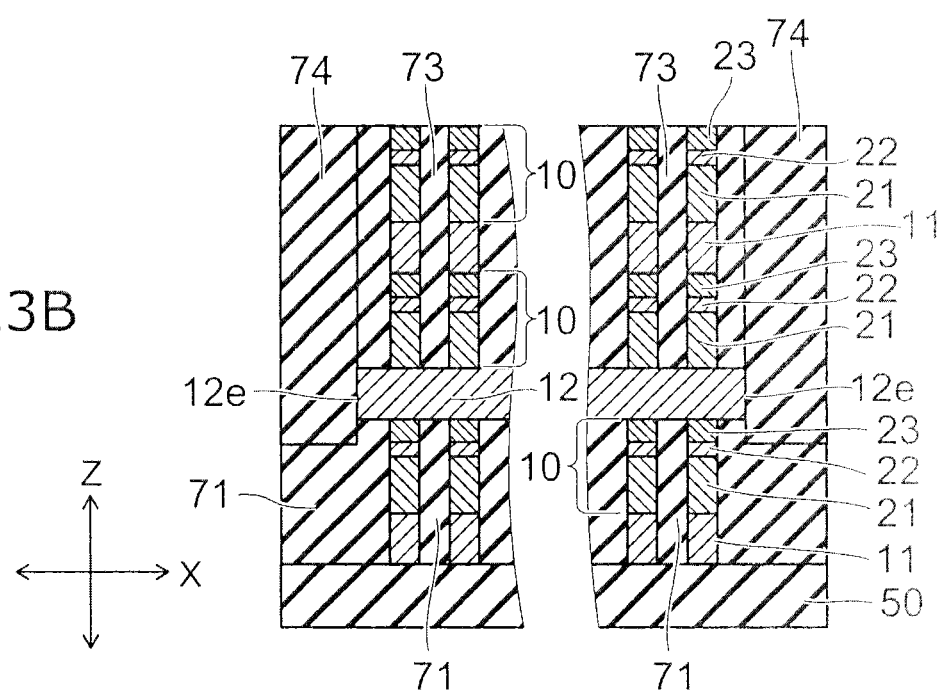

After removing the resist film 65, an end portion insulating film (an inter-layer insulating film) 74 is formed on the portion from which the loop portion 12a of the interconnect 12 is removed as shown in FIG. 23B. The end portion insulating film 74 covers the end wall 12e of the X-direction end of the interconnect 12 of the second layer.

Further, the lower surface of the end portion insulating film 74 exists at a position that is lower than the lower surface of the interconnect 12. In other words, the boundary between the end portion insulating film 74 and the inter-layer insulating film 71 exists at a position that is lower than the lower surface of the interconnect 12. Also, the boundary between the end portion insulating film 74 and the inter-layer insulating film 71 exists to extend in the downward Z direction from the end wall 12e of the interconnect 12.

Moreover, there are cases where a boundary exists between the cell unit insulating film 73 and the end portion insulating film 74. Here, the boundary between the cell unit insulating film 73 and the end portion insulating film 74 exists to extend in the upward Z direction from the end wall 12e of the interconnect 12.

The upper surface of the cell unit insulating film 73 and the upper surface of the end portion insulating film 74 are polished by CMP using the electrode film 23 of the uppermost layer of the stacked film 10 of the third layer as a stopper; and the upper surface of the cell unit insulating film 73 and the upper surface of the end portion insulating film 74 are planarized. Also, the upper surface of the electrode film 23 of the third layer is exposed.

Then, the processes described above are repeated according to the number of layers that is necessary.

The case where the interconnect of the uppermost layer is formed after FIG. 23B will now be described in FIG. 24 to FIG. 27B.

Figure 24:
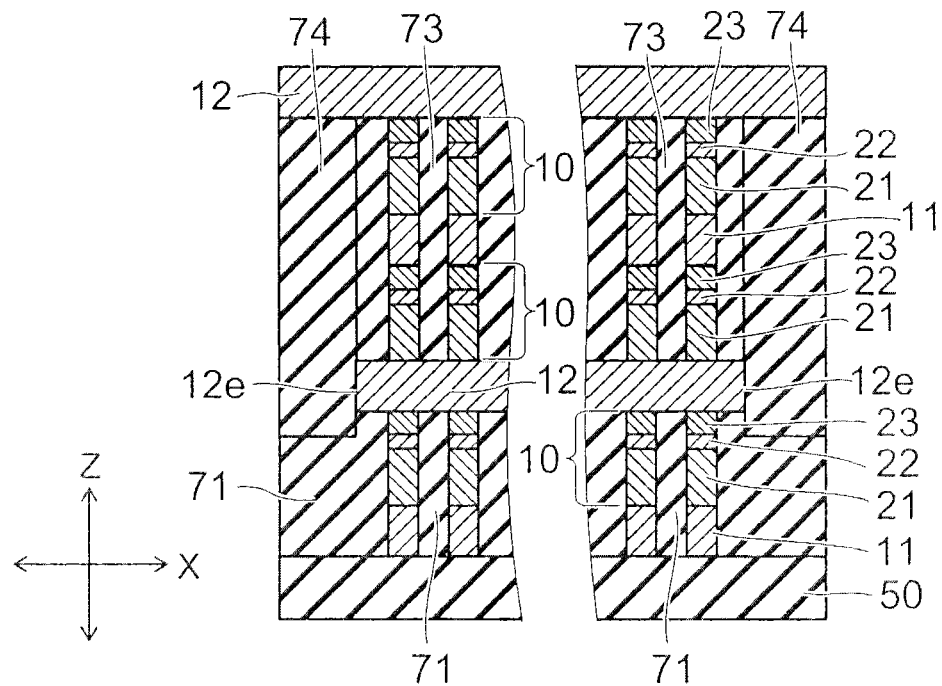

As shown in FIG. 24, the interconnect 12 of the uppermost layer is formed on the stacked film 10 of the third layer from the bottom. Here, in the X direction, the interconnect 12 of the uppermost layer is patterned similarly to the interconnect 12 of the second layer from the bottom.

Figure 25:
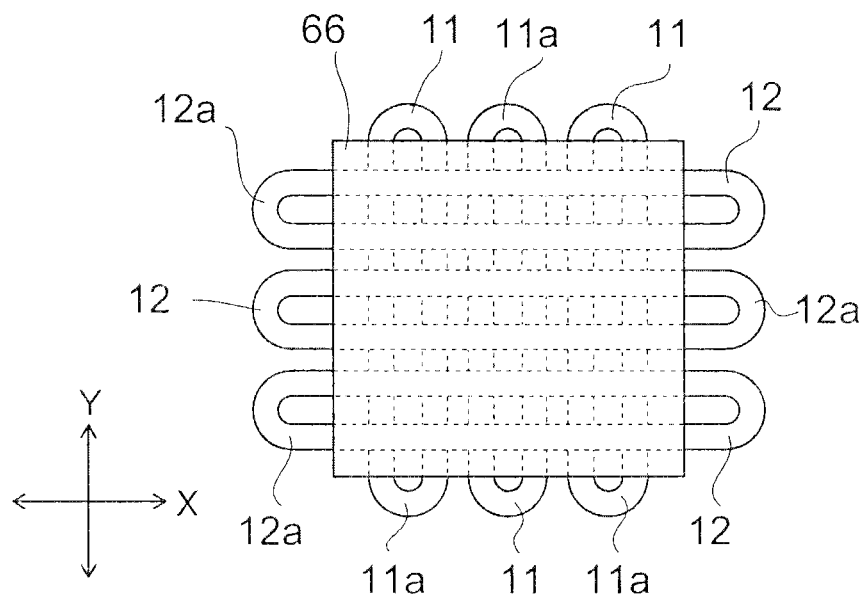

As shown in the plan view of FIG. 25, a mask film, e.g., a resist film 66, is formed on the cell unit insulating film 73 in the cell array region; and the portion exposed from the resist film 66 is etched using the resist film 66 as a mask.

Figure 26A:
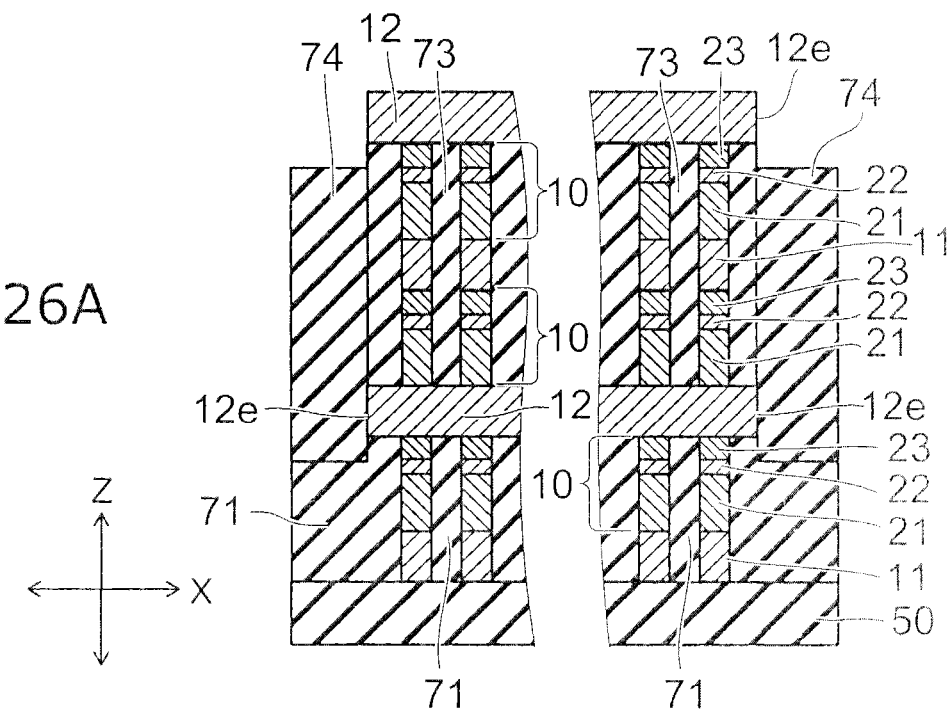
Figure 26B:
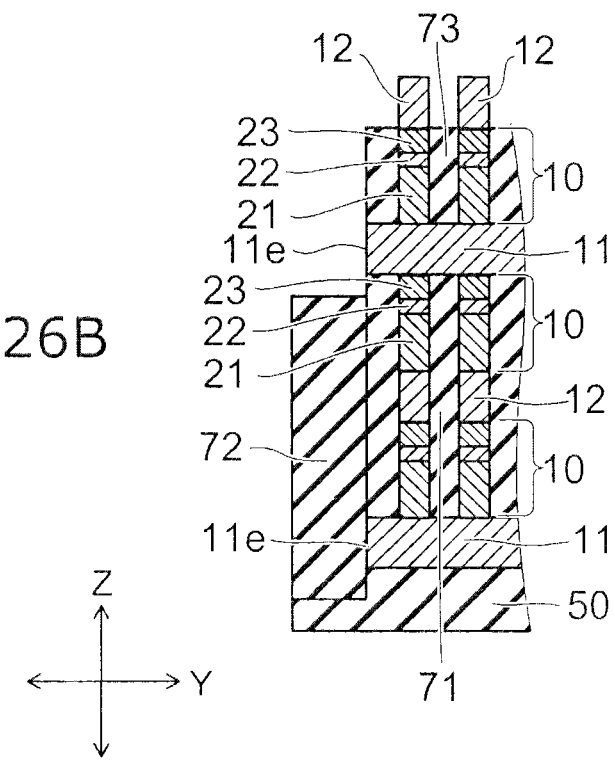

The loop portion 11a of the interconnect 11 of the second layer from the top and the loop portion 12a of the interconnect 12 of the uppermost layer are removed by the same etching process by, for example, RIE using the resist film 66 as a mask. As shown in FIG. 26A that shows the XZ cross section, the loop portion 12a of the X-direction end of the interconnect 12 of the uppermost layer is removed. As shown in FIG. 26B that shows the YZ cross section, the loop portion 11a of the Y-direction end of the interconnect 11 of the second layer from the top is removed. The processes can be simplified because the loop cut of the interconnect 11 of the second layer from the top and the interconnect 12 of the uppermost layer can be performed simultaneously.

Figure 27A:
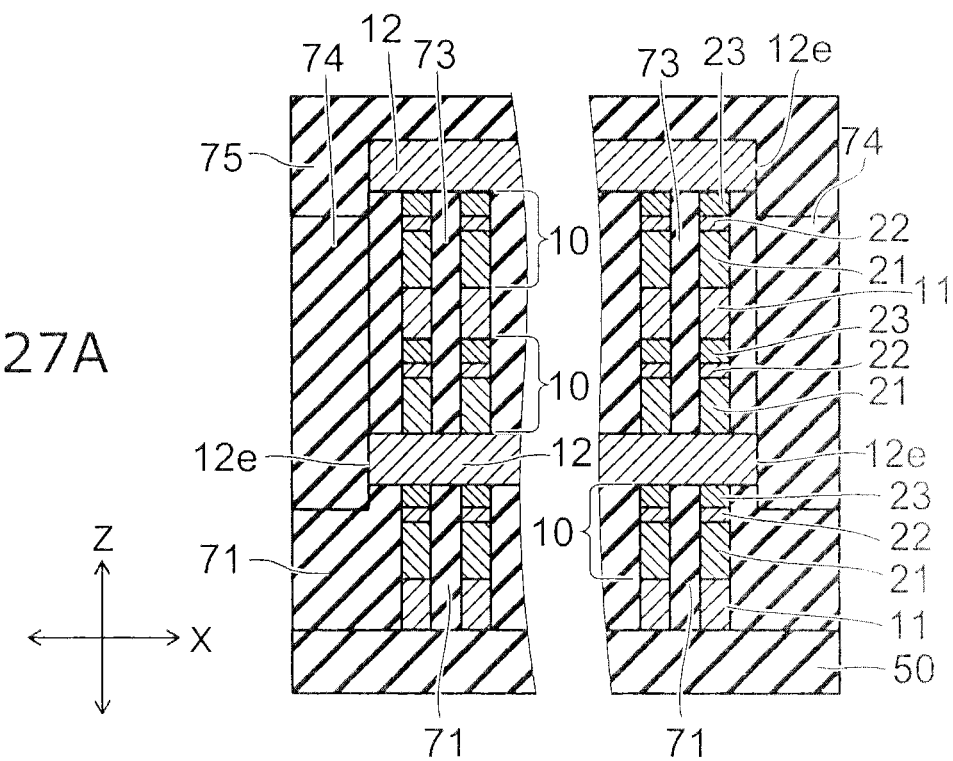
Figure 27B:
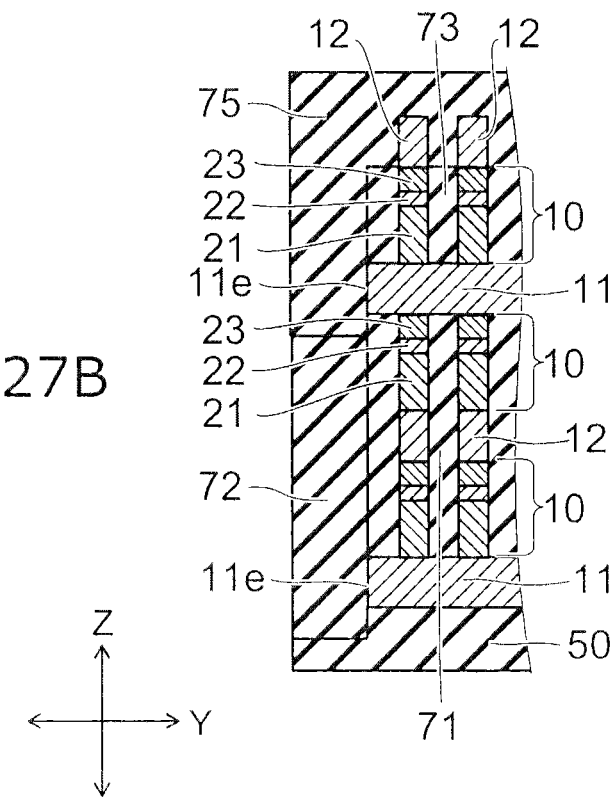

After removing the resist film 66, an end portion insulating film 75 is formed on the portion from which the loop portion of the interconnect 11 of the second layer from the top and the loop portion of the interconnect 12 of the uppermost layer are removed as shown in FIG. 27A and FIG. 27B. The end portion insulating film 75 covers the end portion 11e of the Y-direction end of the interconnect 11 of the second layer from the top and the end portion 12e of the X-direction end of the interconnect 12 of the uppermost layer.

According to the embodiments described above, after patterning the stacked film of the nth layer and the interconnect of the nth layer into closed loop configurations by the nth (n being a positive integer) sidewall transfer process, the interconnect of the (n+1)th layer and the stacked film of the (n+1)th layer are stacked on the stacked film of the nth layer without performing a loop cut of the stacked film of the nth layer and the interconnect of the nth layer at this stage.

Then, the loop portion of the interconnect of the nth layer is removed after the interconnect of the (n+1)th layer and the stacked film of the (n+1)th layer have been patterned together with the stacked film of the nth layer by the (n+1)th sidewall transfer process.

The loop portion of the interconnect of the nth layer is exposed after patterning the interconnect of the (n+1)th layer, the stacked film of the (n+1)th layer, and the stacked film of the nth layer. Accordingly, the object of removal can be only the interconnect; and the loop cut of the interconnect can be performed easily.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
a plurality of interconnects of an nth (n being a positive integer) layer extending in a first direction;
a plurality of interconnects of a (n+1)th layer extending in a second direction crossing the first direction above the interconnects of the nth layer;
a plurality of stacked films of the nth layer provided respectively at portions where the interconnects of the nth layer and the interconnects of the (n+1)th layer cross between the interconnects of the nth layer and the interconnects of the (n+1)th layer, each of the plurality of stacked films of the nth layer including a memory element;
an inter-layer insulating film of the nth layer provided between the plurality of stacked films of the nth layer;
a plurality of interconnects of a (n+2)th layer extending in the first direction above the interconnects of the (n+1)th layer;
a plurality of stacked films of the (n+1)th layer provided respectively at portions where the interconnects of the (n+1)th layer and the interconnects of the (n+2)th layer cross between the interconnects of the (n+1)th layer and the interconnects of the (n+2)th layer, each of the plurality of stacked films of the (n+1)th layer including a memory element; and
an inter-layer insulating film of the (n+1)th layer provided between the plurality of stacked films of the (n+1)th layer and between the plurality of interconnects of the (n+1)th layer,
the inter-layer insulating film of the (n+1)th layer being provided also at a side surface of an end portion in the first direction of the interconnects of the nth layer,
a lower surface of the inter-layer insulating film of the (n+1)th layer exists at a position lower than a lower surface of the interconnects of the nth layer.

2. The semiconductor memory device according to claim 1, wherein a boundary between the inter-layer insulating film of the nth layer and the inter-layer insulating film of the (n+1)th layer exists in a direction extending in a stacking direction from the side surface of the end portion in the first direction of the interconnects of the nth layer.

3. The semiconductor memory device according to claim 1, wherein an inter-layer insulating film of the uppermost layer provided at a side surface of an end portion in the first direction of the interconnects of the uppermost layer is provided also at a side surface of an end portion in the second direction of the interconnects of the layer one layer down from the uppermost layer.

4. A semiconductor memory device, comprising:
a plurality of interconnects of an nth (n being a positive integer) layer extending in a first direction;
a plurality of interconnects of a (n+1)th layer extending in a second direction crossing the first direction above the interconnects of the nth layer;
a plurality of stacked films of the nth layer provided respectively at portions where the interconnects of the nth layer and the interconnects of the (n+1)th layer cross between the interconnects of the nth layer and the interconnects of the (n+1)th layer, each of the plurality of stacked films of the nth layer including a memory element;

an inter-layer insulating film of the nth layer provided between the plurality of stacked films of the nth layer;

a plurality of interconnects of a (n+2)th layer extending in the first direction above the interconnects of the (n+1)th layer;

a plurality of stacked films of the (n+1)th layer provided respectively at portions where the interconnects of the (n+1)th layer and the interconnects of the (n+2)th layer cross between the interconnects of the (n+1)th layer and the interconnects of the (n+2)th layer, each of the plurality of stacked films of the (n+1)th layer including a memory element; and an inter-layer insulating film of the (n+1)th layer provided between the plurality of stacked films of the (n+1)th layer and between the plurality of interconnects of the (n+1)th layer;

the inter-layer insulating film of the (n+1)th layer being provided also at a side surface of an end portion in the first direction of the interconnects of the nth layer, the inter-layer insulating film of the nth layer having a boundary being in contact with the inter-layer insulating film of the (n+1)th layer.

5. The semiconductor memory device according to claim 4, wherein a lower surface of the inter-layer insulating film of the (n+1)th layer exists at a position lower than a lower surface of the interconnects of the nth layer.

6. The semiconductor memory device according to claim 4, wherein the boundary between the inter-layer insulating film of the nth layer and the inter-layer insulating film of the (n+1)th layer exists in a direction extending in a stacking direction from the side surface of the end portion in the first direction of the interconnects of the nth layer.

7. The semiconductor memory device according to claim 4, wherein an inter-layer insulating film of the uppermost layer provided at a side surface of an end portion in the first direction of the interconnects of the uppermost layer is provided also at a side surface of an end portion in the second direction of the interconnects of the layer one layer down from the uppermost layer.

* * * * *